United States Patent
Morita et al.

[11] Patent Number: 6,091,077
[45] Date of Patent: Jul. 18, 2000

[54] MIS SOI SEMICONDUCTOR DEVICE WITH RTD AND/OR HET

[75] Inventors: Kiyoyuki Morita, Kyoto; Kiyoshi Morimoto, Osaka; Koichiro Yuki, Osaka; Kiyoshi Araki, Osaka, all of Japan

[73] Assignee: Matsushita Electric Industrial Co., Ltd., Osaka, Japan

[21] Appl. No.: 08/955,267

[22] Filed: Oct. 21, 1997

[30] Foreign Application Priority Data

Oct. 22, 1996 [JP] Japan .................................. 8-279091

[51] Int. Cl.[7] .............................. H01L 29/88; H01L 29/06
[52] U.S. Cl. ................................ 257/25; 257/26; 257/29; 257/348; 257/350
[58] Field of Search .................... 257/25, 26, 29, 257/348, 350, 368

[56] References Cited

U.S. PATENT DOCUMENTS

| | | | |
|---|---|---|---|
| 5,444,267 | 8/1995 | Okada et al. | 259/14 |
| 5,514,614 | 5/1996 | Yuki et al. | 438/141 |
| 5,541,422 | 7/1996 | Wolf et al. | 438/141 |
| 5,723,872 | 3/1998 | Seabaugh et al. | 257/25 |
| 5,739,544 | 4/1998 | Yuki et al. | 257/25 |

FOREIGN PATENT DOCUMENTS

| | | |
|---|---|---|
| 04275455 | 1/1992 | Japan . |
| 05235378 | 10/1993 | Japan . |

*Primary Examiner*—John Guay
*Attorney, Agent, or Firm*—McDermott, Will & Emery

[57] ABSTRACT

The invention provides a semiconductor device, having a variety of functions such as a bistable memory and a logic circuit, in which a MOS semiconductor element, a resonance tunnel diode, a hot electron transistor and the like are formed on a common substrate. An n-type Si layer and a p-type Si layer surrounded with an isolation oxide film are formed on an SOI substrate. A mask oxide film and a gate oxide film are formed, and the n-type Si layer is subjected to crystal anisotropic etching by using the mask oxide film as a mask, so as to change the n-type Si layer into the shape of a thin Si plate. After first and second tunnel oxide films are formed on side faces of this n-type Si layer, first and second polysilicon electrodes of a resonance tunnel diode and a polysilicon electrode working as a gate electrode of a MOS semiconductor element are formed out of a common polysilicon film. Thus, a $Si/SiO_2$ type quantum device can be manufactured with ease at a low cost.

13 Claims, 13 Drawing Sheets

MIS SOI SEMICONDUCTOR DEVICE WITH RTD AND/OR HET

BACKGROUND OF THE INVENTION

The present invention relates to a semiconductor device functioning as a bistable memory or a logic circuit and including a MIS semiconductor element, a hot electron transistor, a resonance tunnel diode, that is, a non-linear element, and the like formed on a common substrate, and also to a method of manufacturing the semiconductor device.

Recently, various types of elements whose operational principle is totally different from that of a MIS semiconductor element have been proposed, and a resonance tunnel element is one of these recently proposed elements. A resonance tunnel element has a "double barrier structure", in which a semiconductor thin film, having a thickness sufficiently small to cause a quantum effect, is sandwiched between energy barrier films of an oxide film or the like and electrodes are formed on the outer faces of the energy barrier films. The electric characteristic of the resonance tunnel element is controlled by a resonance tunnel effect that application of a given voltage between the two electrodes simultaneously causes tunneling of electrons between the semiconductor thin film and the two electrodes. Many of conventional resonance tunnel diodes are obtained by using a compound semiconductor (Tsu, Esaki et al., Appl. Phys. Lett., 22, 562 (1973), etc.). This is because the compound semiconductor has the following advantages: The compound semiconductor is a direct transition type semiconductor material and has a small effective mass, in which the resonance tunnel effect can be easily caused; the compound semiconductor can be used as an energy barrier film because of its semi-insulating property; and the compound semiconductor can be easily formed into a thin film by utilizing the epitaxial growth because it is a crystalline material.

In contrast, there is a demand for a resonance tunnel element made from a general semiconductor material such as silicon because the compound semiconductor has limited application in view of the manufacturing cost. However, silicon is an indirect transition type semiconductor material, and its effective mass is larger, namely, the mobility is smaller, than that of the compound semiconductor and hence, the resonance tunnel effect cannot be easily caused. In addition, when silicon is used, a silicon oxide film, a silicon nitride film or the like is used as the energy barrier film, but the silicon oxide film or the like is an amorphous material and hence is very difficult to be formed by the epitaxial growth.

On the other hand, another example of the elements utilizing the quantum effect apart from the resonance tunnel element includes a hot electron transistor. The hot electron transistor has the "double barrier structure", in which a semiconductor thin film, having a thickness sufficiently small to cause the quantum effect, is sandwiched between energy barrier films of an oxide film or the like and electrodes are formed on the outer faces of the energy barrier films. In this structure, when a voltage is applied between one electrode and the semiconductor film, hot electrons tunnel through one energy barrier film to be injected into the semiconductor film from the electrode. The injected electrons lose their energy within the semiconductor thin film owing to the lattice vibration or the like, but when the semiconductor film is thin, a certain proportion of the electrons can pass through the semiconductor film. Since another energy barrier film is formed in contact with the semiconductor film, hot electrons alone can reach another electrode through this energy barrier film. Electric power can be amplified by making a current flowing from one electrode through the semiconductor film to the other electrode be larger than a current flowing from one electrode into the semiconductor thin film by providing any structural means. Such an element can be advantageously operated normally even at a low temperature because it does not include a pn junction as a bipolar element. Many of conventional hot electron transistors are realized by using a compound semiconductor. This is because the compound semiconductor can be used as an energy barrier film because of its semi-insulating property and can be easily formed into a very thin semiconductor film by the epitaxial growth since it is a crystalline material.

Although the resonance tunnel diode is an element with a large number of possibilities, it is difficult to constitute a variety of circuits by using the tunnel diode alone because it has merely two terminals, i.e., two electrodes.

Furthermore, with regard to the hot electron transistor, the usage of the compound semiconductor limits its application in view of the manufacturing cost, and there is a demand for a hot electron transistor made from a general semiconductor material such as silicon. However, since silicon is not a semi-insulating semiconductor material, a silicon oxide film, a silicon nitride film or the like is used as an energy barrier film. Therefore, in order to sandwich a semiconductor thin film with two energy barrier films, it is necessary to form a monocrystalline silicon film on the silicon oxide film or the like. However, it is very difficult to epitaxially grow the monocrystalline silicon film on the silicon oxide film or the like, that is, a film of an amorphous material, because lattice mismatching is caused in such a case.

SUMMARY OF THE INVENTION

A first object of the invention is providing a semiconductor device having a variety of functions such as a bistable memory and a multi-valued logic circuit through combination of a resonance tunnel diode, that is, a non-linear element, and a MIS semiconductor element.

A second object of the invention is providing a practical method of manufacturing a semiconductor device utilizing a manufacturing process for a general MOS semiconductor device, so that a MIS semiconductor element and a resonance tunnel diode can be formed on a common substrate in as few processes as possible.

A third object of the invention is providing a semiconductor device having a variety of functions and a method of manufacturing the semiconductor device by making a hot electron transistor having a function corresponding to that of a bipolar transistor have a structure applicable to a silicon process.

For achieving the first object, the invention provides first through third semiconductor devices.

The first semiconductor device, functioning as a bistable memory cell or a logic circuit, of this invention comprises a resonance tunnel diode including first and second conductive portions and a resonance tunneling portion interposed between the first and second conductive portions; and a MIS semiconductor element including a gate electrode and source/drain electrodes, wherein the resonance tunnel diode and the MIS semiconductor element are formed on a common substrate, and at lest one of the source/drain electrodes of the MIS semiconductor element is electrically connected with at least one of the first and second conductive portions of the resonance tunnel diode.

Thus, various types of circuits having a variety of functions can be attained through the combination of a MIS semiconductor element and a resonance tunnel diode.

In one aspect, the resonance tunneling portion of the resonance tunnel diode can include a very thin Si layer sandwiched between two tunnel insulating films.

Thus, the resonance tunnel diode and the MIS semiconductor element can be mounted on the common silicon substrate, and hence, a semiconductor device mounting both an inexpensive Si type quantum device and a MIS semiconductor element can be practically realized.

In another aspect, the MIS semiconductor element can be a depletion type semiconductor element, the gate electrode and the source electrode of the MIS semiconductor element can be short-circuited to be connected with a power terminal, the drain electrode of the MIS semiconductor element and one of the first and second conductive portions of the resonance tunnel diode can be connected with a common control terminal, and the semiconductor device can function as a bistable memory cell.

Thus, among plural intersections between the voltage-current characteristic of the resonance tunnel diode and the voltage-current characteristic of the MIS semiconductor element, an intersection having different signs of the gradients obtained as a change of a voltage in accordance with a change of a current is a stable point of the semiconductor device. Therefore, a bistable memory cell utilizing this characteristic can be obtained. As a result, the resultant semiconductor device can function as a memory cell with a high operation speed and small current consumption by utilizing the good characteristic of the resonance tunnel effect.

The second semiconductor device of this invention comprises a substrate including an insulator portion, and a resonance tunnel diode and a MIS semiconductor element formed on the insulator portion and insulated from each other, wherein the resonance tunnel diode includes a semiconductor film in the shape of a very thin plate extending along a direction crossing a surface of the insulator portion; first and second tunnel insulating films formed on respective faces of the semiconductor film, each having potential energy sufficiently large to work as a barrier against movement of electrons and a lateral thickness sufficiently small to allow electrons to tunnel therethrough; first and second conductive portions respectively formed on outer faces of the first and second tunnel insulating films; and a mask insulating film formed on the semiconductor film and the first and second tunnel insulating films, the MIS semiconductor element includes a channel region formed on the insulator portion; source/drain regions formed at both sides of the channel region; a gate insulating film formed on the channel region; and a gate electrode formed on the gate insulating film, and the mask insulating film of the resonance tunnel diode and the gate insulating film of the MIS semiconductor element are made from a common insulator material.

In this manner, the mask insulating film of the resonance tunnel diode and the gate insulating film of the MIS semiconductor element are formed out of the common insulator material, and hence, these films can be formed in the common step in the manufacturing procedures, resulting in decreasing a manufacturing cost.

The third semiconductor device of this invention comprises a substrate including an insulator portion and a resonance tunnel diode and a MIS semiconductor element formed on the insulator portion and insulated from each other, wherein the resonance tunnel diode includes a semiconductor film in the shape of a very thin plate extending along a direction crossing a surface of the insulator portion; first and second tunnel insulating films formed on respective faces of the semiconductor film, each having potential energy sufficiently large to work as a barrier against movement of electrons and a lateral thickness sufficiently small to allow electrons to tunnel therethrough; first and second conductive portions respectively formed on outer faces of the first and second tunnel insulating films; and a mask insulating film formed on the semiconductor film and the first and second tunnel insulating films, the MIS semiconductor element includes a channel region formed on the insulator portion; source/drain regions formed at both sides of the channel region; a gate insulating film formed on the channel region; and a gate electrode formed on the gate insulating film, and the first and second conductive portions of the resonance tunnel diode and the gate electrode of the MIS semiconductor element are made from a common conductor material.

In this manner, the first and second conductive portions of the resonance tunnel diode and the gate electrode of the MIS semiconductor element are formed out of the common conductor material, and hence, these films can be formed in the common step in the manufacturing procedures, resulting in decreasing a manufacturing cost.

For achieving the second object, the invention provides first through third methods of manufacturing a semiconductor device.

The first method, of this invention, of manufacturing a semiconductor device including a MIS semiconductor element having a gate electrode, a gate insulating film and a channel region and source/drain regions of semiconductor, and a resonance tunnel diode having a semiconductor film, first and second tunnel insulating films sandwiching the semiconductor film, first and second conductive portions respectively adjacent to outer faces of the first and second tunnel insulating films and a mask insulating film formed on the semiconductor film and the first and second tunnel insulating films, the MIS semiconductor element and the resonance tunnel diode being formed on one substrate, comprises a step of depositing a conductive film on the substrate after forming the gate insulating film of the MIS semiconductor element and the semiconductor film, the mask insulating film and the first and second tunnel insulating films of the resonance tunnel diode; and a step of simultaneously forming the gate electrode of the MIS semiconductor element and the first and second conductive portions of the resonance tunnel diode by patterning the conductive film.

In one aspect, the method further can comprise, prior to the step of depositing the conductive film on the substrate, a step of simultaneously forming oxide films constituting the gate insulating film of the MIS semiconductor element and the mask insulating film of the resonance tunnel diode by oxidizing the semiconductor film and the channel region.

In another aspect, a polysilicon film can be deposited as the conductive film in the step of depositing the conductive film on the substrate.

In this manner, the first and second conductive portions of the resonance tunnel diode and the gate electrode of the MIS semiconductor element can be formed by patterning the common conductor film. Therefore, the resonance tunnel diode can be formed by, for example, utilizing a single-layer polysilicon process generally adopted for the manufacture of a MIS semiconductor element. Accordingly, the manufacture of the semiconductor device can be eased and the manufacturing cost can be decreased.

In still another aspect, in the case where the semiconductor device further includes a hot electron transistor, formed on the substrate, having a semiconductor film, tunnel insulating/energy barrier films sandwiching the semiconductor film, first and second conductive portions respectively adjacent to outer faces of the tunnel insulating/energy barrier films, and a mask insulating film formed on the semiconductor film and the tunnel insulating/energy barrier films, the step of depositing the conductive film on the substrate is preferably effected after forming the gate insulating film of the MIS semiconductor element, the semiconductor film, the first and second tunnel insulating films and the mask insulating film of the resonance tunnel diode, and the semiconductor film, the tunnel insulating/energy barrier films and the mask insulating film of the hot electron transistor, and the first and second conductive portions of the hot electron transistor are preferably simultaneously formed in the step of simultaneously forming the gate electrode of the MIS semiconductor element and the first and second conducive portions of the resonance tunnel diode.

Thus, the conductive portions of the resonance tunnel diode and the gate electrode of the MIS semiconductor element are formed by patterning the common conductor film. Therefore, the resonance tunnel diode can be formed by, for example, utilizing the single-layer polysilicon process generally adopted for the manufacture of a MIS semiconductor element. Accordingly, the manufacture of the semiconductor device can be eased and the manufacturing cost can be decreased.

The second method, of this invention, of manufacturing a semiconductor device comprises a first step of forming an SOI substrate including a monocrystalline semiconductor layer in an upper portion and an insulator portion below the monocrystalline semiconductor layer; a second step of forming an isolation for partitioning the monocrystalline semiconductor layer of the SOI substrate into at least a first semiconductor area and a second semiconductor area; a third step of forming first and second insulating films respectively on surfaces of the first and second semiconductor areas; a fourth step of forming a mask insulating film with the first semiconductor area exposed at both sides of the mask insulating film by removing end portions of the first insulating film; a fifth step of changing the first semiconductor area into a thin semiconductor film having crystal surfaces with a low etching rate as side faces thereof by conducting crystal anisotropic etching with the mask insulating film used as a mask; a sixth step of forming first and second tunnel insulating films of a resonance tunnel diode, on the side faces of the semiconductor film, each having potential energy sufficiently large to work as a barrier against movement of electrons and a lateral thickness sufficiently small to allow electrons to tunnel therethrough; a seventh step of forming an electrode conductive film on an entire surface of the substrate; an eighth step of forming a gate electrode of a MIS semiconductor element on the second insulating film by patterning the electrode conductive film on the second semiconductor area; and a ninth step of forming source/drain regions of the MIS semiconductor element by introducing an impurity into areas at both sides of the gate electrode in the second semiconductor area.

Thus, the resonance tunnel diode and the MIS semiconductor element can be easily formed to be insulated from each other on the common substrate. In addition, the mask insulating film of the resonance tunnel diode and the gate insulating film of the MIS semiconductor element can be formed out of the first and second insulating films simultaneously formed, resulting in decreasing the manufacturing cost.

In one aspect, in the first step, the monocrystalline semiconductor layer is preferably formed to have the {110} oriented surface as a principle surface, and in the fourth step, the {111} oriented surface is preferably selected as the crystal surfaces of the first semiconductor area with the low etching rate.

In this manner, although an easily practically used Si type process is used in stead of a compound semiconductor process, the {111} oriented surface having large etching resistance can be used as the vertical face to the substrate, and hence, the tunnel insulating films and the conductive portions can be easily formed on the side faces. In addition, the resultant tunnel diode can attain a very small size.

In another aspect, a silicon oxide film is preferably formed as the first and second tunnel insulating films.

Thus, the silicon oxide film, through which electrons can easily pass owing to the tunnel effect, can be used as the tunnel insulating film, and hence, the resultant tunnel diode can attain a good electric characteristic.

The third method of manufacturing a semiconductor device of this invention comprises a first step of forming an SOI substrate having a monocrystalline semiconductor layer in an upper portion and an insulator portion below the monocrystalline semiconductor layer; a second step of forming an isolation for partitioning the monocrystalline semiconductor layer of the SOI substrate into at least a first semiconductor area and a second semiconductor area; a third step of forming first and second insulating films respectively on the first and second semiconductor areas; a fourth step of forming a mask insulating film by patterning the first insulating film, the mask insulating film having a predetermined positive value as a distance between innermost points among contact points between side faces of the mask insulating film and crystal surfaces of the first semiconductor area having a low etching rate; a fifth step of conducting crystal anisotropic etching with the mask insulating film used as a mask until the first semiconductor area becomes a semiconductor film having the crystal surfaces with the low etching rate as side faces thereof and a lateral thickness of the semiconductor film substantially accords with the predetermined positive value of the mask insulating film; and a sixth step of forming first and second tunnel insulating films of a resonance tunnel diode, on the side faces of the semiconductor film, each having potential energy sufficiently large to work as a barrier against movement of electrons and a lateral thickness sufficiently small to allow electrons to tunnel therethrough.

In this manner, the lateral thickness of the semiconductor film playing a significant role in obtaining the resonance tunnel effect of the resonance tunnel diode can be determined in accordance with not the etching time but the shape of the mask insulating film. Accordingly, while the semiconductor film is being made into a very thin plate, its lateral thickness can be controlled at high accuracy.

In one aspect, in the fifth step, the first semiconductor area can be etched to have a lateral thickness of 2 through 10 nm.

As a result, the resonance tunnel effect can be definitely attained.

For achieving the third object, the invention provides means regarding a fourth semiconductor device and means regarding a fourth method of manufacturing a semiconductor device.

The fourth semiconductor device of this invention comprises a hot electron transistor mounted on a substrate including an insulator portion, wherein the hot electron transistor includes a semiconductor film formed on the insulator portion out of a semiconductor material in the shape of a very thin plate extending along a direction crossing a surface of the insulator portion; a tunnel insulating film formed on one side face of the semiconductor film, having potential energy sufficiently large to work as a barrier against movement of electrons and a lateral thickness sufficiently small to allow electrons to tunnel therethrough; an energy barrier film formed on the other side face of the semiconductor film having potential energy sufficiently large to work as a barrier against movement of electrons; first and second conductive portions respectively formed on outer faces of the tunnel insulating film and the energy barrier film; and a mask insulating film formed on the semiconductor film, the tunnel insulating film and the energy barrier film, wherein potentials of the first conductive portion, the semiconductor film and the second conductive portion are adjusted so that carriers move from the first conductive portion to the semiconductor film by tunneling and that carriers move from the semiconductor film to the second conductive portion through the energy barrier film.

Thus, in the resultant hot electron transistor, carriers move not in the vertical direction but in the lateral direction along the substrate. Such a structure does not require formation of monocrystal on the insulating film, which is required in a hot electron transistor where carriers move in the vertical direction. In addition, there is no need to use a compound semiconductor. Accordingly, the hot transistor which can exhibit the power amplifying function similarly to a bipolar transistor at a low temperature can be formed at a high density and at a low cost.

In one aspect, a bottom face of the semiconductor film is preferably the {110} oriented surface, side faces of the semiconductor film are preferably the {111} oriented surface, and the semiconductor film preferably extends along a direction substantially vertical to the surface of the insulator portion.

As a result, the semiconductor film can be stabilized and rigid, resulting in improving the reliability of the semiconductor device.

In another aspect, the tunnel insulating film and the energy barrier film are preferably made from an oxide film formed by oxidizing a surface area of the semiconductor film.

Thus, by utilizing an oxide film whose lateral thickness can be easily controlled and which has a satisfactory electric characteristic, a hot electron transistor with a good characteristic can be manufactured at a low cost.

In still another aspect, the semiconductor film is preferably made from a monocrystalline silicon film, and the tunnel insulating film and the energy barrier film are preferably made from a silicon oxide film.

Thus, it is possible to obtain an inexpensive semiconductor device utilizing not compound semiconductor but generally used silicon.

In still another aspect, the first and second conducive portions are preferably made from a polysilicon film.

Thus, it is possible to obtain an inexpensive semiconductor device which can be manufactured by a generally used polysilicon process.

In still another aspect, an impurity of a first conductivity type is preferably introduced into the semiconductor film, and an impurity of a second conductivity type is preferably introduced into the polysilicon film.

Thus, it is possible to obtain a hot electron transistor having a satisfactory operation characteristic and a function similar to that of an npn bipolar transistor or a pnp bipolar transistor.

In a hot electron transistor, a current can be controlled by a potential barrier of the energy barrier film, and hence, the power amplifying function similar to that of a bipolar transistor can be obtained even when the semiconductor film and the polysilicon film have the same conductivity type. However, when these films include impurities of different conductivity types, the resultant hot electron transistor can exhibit a better operation characteristic.

This invention also provides a semiconductor device including, on the insulator portion of the common substrate, a MIS semiconductor element or a resonance tunnel diode including a member made from a common material with a member of the hot electron transistor.

The fourth method, of this invention, of manufacturing a semiconductor device comprises a first step of forming an SOI substrate having a monocrystalline semiconductor layer in an upper portion and an insulator portion below the monocrystalline semiconductor layer; a second step of forming an insulating film on the monocrystalline semiconductor layer; a third step of forming, out of the insulating film, a mask insulating film having a wide portion and a narrow portion with the monocrystalline semiconductor layer exposed at both sides of the mask insulating film; a fourth step of forming a thin semiconductor film having, as side faces, crystal surfaces with a low etching rate and extending along a direction crossing a surface of the insulator portion and a wide pad region communicated with the semiconductor film, by conducting crystal anisotropic etching with the mask insulating film used as a mask; a fifth step of forming a tunnel insulating film having potential energy sufficiently large to work as a barrier against movement of electrons and a lateral thickness sufficiently small to allow electrons to tunnel therethrough on one side face of the semiconductor film, and forming an energy barrier layer having potential energy sufficiently large to work as a barrier against movement of electrons on the other side face of the semiconductor film; and a sixth step of forming an electrode conductive film on an entire surface of the substrate, and forming a first conductive portion adjacent to the tunnel insulating film and a second conductive portion adjacent to the energy barrier layer by patterning the electrode conductive film.

In this manner, after forming the semiconductor film, the tunnel insulating and energy barrier films are formed at respective sides thereof. Therefore, even when a general semiconductor material such as silicon is used in stead of a compound semiconductor, it is possible to avoid a difficulty in forming a monocrystalline semiconductor film with a highly accurate lateral thickness on the insulating film. As a result, it is possible to easily manufacture a hot electron transistor which can exhibit the power amplifying function similarly to a bipolar transistor at a low temperature.

In one aspect, in the fourth step, a distance between two innermost points among contact points between side faces of the narrow portion of the mask insulating film and the crystal faces of the monocrystalline semiconductor layer with the low etching late preferably has a predetermined positive value.

In this manner, the lateral thickness of the semiconductor film playing a significant role in the operation of the hot electron transistor can be accurately controlled by utilizing the fact that respective crystal surfaces in the monocrystalline semiconductor layer have different etching rates. As a result, it is possible to easily manufacture a hot electron transistor having a desired characteristic.

In another aspect, in the fifth step, the semiconductor film is preferably made to have a lateral thickness of 2 through 10 nm.

Thus, in the resultant structure, a large proportion of carriers flowing from the first conductive portion to the semiconductor film do not stay in the semiconductor film but further move to the second conductive portion. Accordingly, the resultant hot electron transistor can attain a high current amplifying rate.

In still another aspect, in the first step, the monocrystalline semiconductor layer is preferably formed to have the {110} oriented surface as a principle surface, and in the fourth step, the {111} oriented surface is preferably selected as the crystal faces of the monocrystalline semiconductor layer with the low etching rate.

In this manner, although the very thin semiconductor film is formed during the manufacture, the semiconductor film hardly falls because it extends in the vertical direction, and hence, the procedures thereafter can be stably effected.

In still another aspect, in the fifth step, the tunnel insulating film and the energy barrier film are preferably formed out of an oxide film by oxidizing a surface area of the semiconductor film.

Thus, the tunnel insulating and energy barrier films can be made from an oxide film whose thickness can be easily controlled and which has a good insulating property.

In still another aspect, in the first step, the monocrystalline semiconductor layer of the hot electron transistor is preferably made from a monocrystalline silicon film, and in the fifth step, the tunnel insulating film and the energy barrier film are preferably made from a silicon oxide film.

Thus, a $Si/SiO_2$ type hot electron transistor can be easily formed.

In still another aspect, in the sixth step, the first and second conductive portions are preferably made from a polysilicon film.

Thus, a $Si/SiO_2$ type hot electron transistor can be inexpensively and easily manufactured by utilizing a general polysilicon process.

In still another aspect, in the first step, an impurity of a first conductivity type is preferably introduced into the monocrystalline semiconductor layer, and in the sixth step, an impurity of a second conductivity type is preferably introduced into the polysilicon film.

Thus, it is possible to manufacture a hot electron transistor having an operation charactersitc similar to that of an npn bipolar transistor or a pnp bipolar transistor.

This invention also provides a method of manufacturing a semiconductor device including, on the insulator portion of the common substrate, a MIS semiconductor element or a resonance tunnel diode having a member made from a common material with a member of the hot electron.

DETAILED DESCRIPTION OF THE INVENTION (Embodiment 1)

A first embodiment of the invention will now be described with reference to FIGS. 1 through 8, which are sectional views for showing manufacturing procedures for a semiconductor device of this embodiment.

Figure 1:
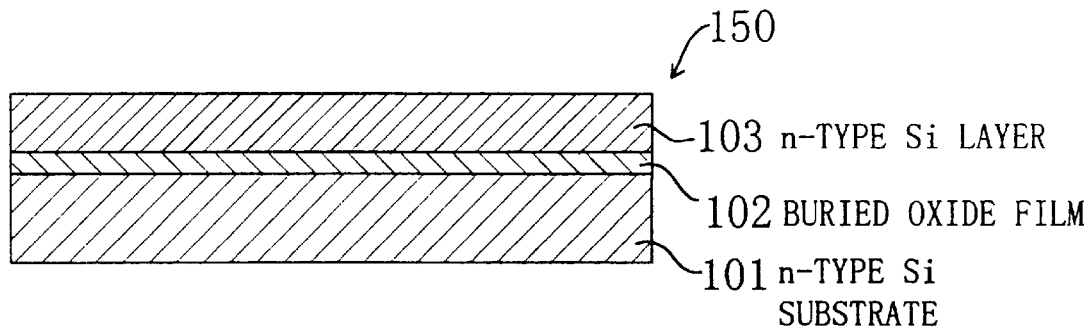
FIG. 1 is a sectional view for showing a step of forming an SOI substrate in manufacturing procedures for a semiconductor device according to a first embodiment.

First, in the procedure shown in FIG. 1, an SOI substrate 150 is formed by, for example, implanting oxygen ions in an n-type silicon substrate. The SOI substrate 150 includes an n-type Si substrate 101, a buried oxide film 102 formed on the n-type Si substrate 101 and an n-type Si layer 103 formed on the buried oxide film 102. The principal surface of at least the n-type Si layer 103 in the SOI substrate 150 is the {110} oriented surface. Also, the facet direction of the n-type Si substrate 101 accords with the <112>orientation, and FIGS. 1 through 8 show the section perpendicular to the facet direction. The n-type Si layer 103 has a vertical thickness of approximately 100 through 200 nm.

Figure 2:
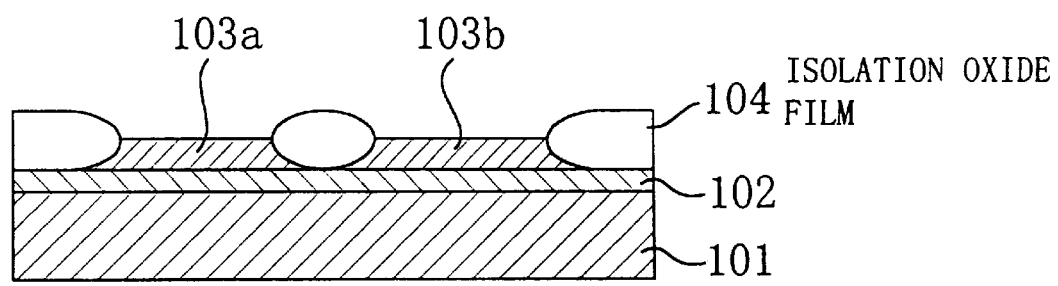
FIG. 2 is a sectional view for showing a step of forming an isolation oxide film in the manufacturing procedures for the semiconductor device of the first embodiment.

Next, in the procedure shown in FIG. 2, an isolation oxide film 104 is formed in a part of the n-type Si layer 103 by selective oxidation or the like, so as to partition the n-type Si layer 103 into isolated areas 103a, 103b, etc. The isolation oxide film 104 has a thickness sufficient for electrically insulating the n-type Si layers 103a, 103b, etc. from one another, and hence the thickness is approximately the same as or twice as large as that of the n-type Si layer 103.

Figure 3:
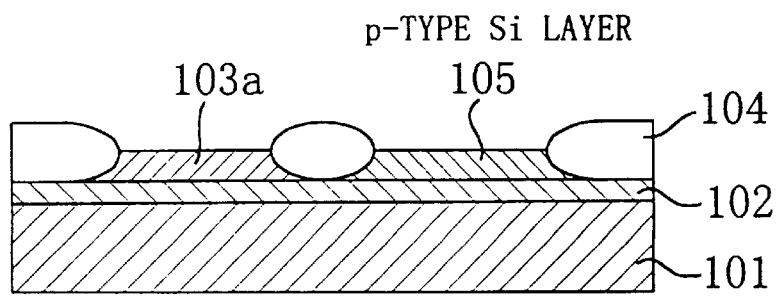
FIG. 3 is a sectional view for showing a step of forming an n-type Si layer in the manufacturing procedures for the semiconductor device of the first embodiment.

Then, in the procedure shown in FIG. 3, one n-type Si layer 103b surrounded with the isolation oxide film 104 is changed into a p-type Si layer 105 through photolithography, ion implantation and annealing. The conditions for the ion implantation and the annealing depend upon the size of a MOS semiconductor element to be formed, and in this embodiment, phosphorus ions are implanted under conditions of an implantation energy of 40 keV and a dose of $10^{12}/cm^2$, and the activation is effected at a temperature of 950° for 60 minutes. This procedure can be immediately followed by ion implantation and annealing for setting the threshold voltage of the MOS semiconductor element at a desired value.

Figure 4:
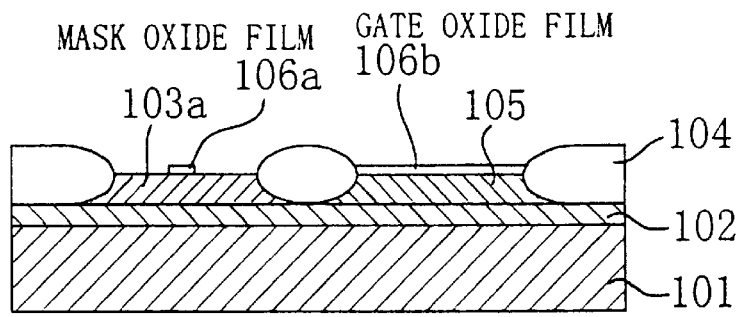
FIG. 4 is a sectional view for showing a step of forming a mask oxide film and a gate oxide film in the manufacturing procedures for the semiconductor device of the first embodiment.

Next, in the procedure shown in FIG. 4, the surface of the substrate is oxidized, thereby forming a mask oxide film 106a and a gate oxide film 106b, each with a thickness of approximately 10 nm, on the n-type Si layer 103a and the p-type Si layer 105, respectively. Both ends of the mask oxide film 106a are removed by the photolithography and drying etching, so that the mask oxide film 106a remains merely on the center of the n-type Si layer 103a. In other words, the n-type Si layer 103a is exposed at both sides of the mask oxide film 106a. At this point, the mask oxide film 106a has a width of approximately 100 nm, but the width can be freely determined if occasion demands. Furthermore, the thickness of the mask oxide film 106a can be approximately 2 through 3 nm without causing any problem in subsequent procedures. In contrast, the gate oxide film 106b entirely remains, and hence the surface of the p-type Si layer 105 is not exposed.

Figure 5:
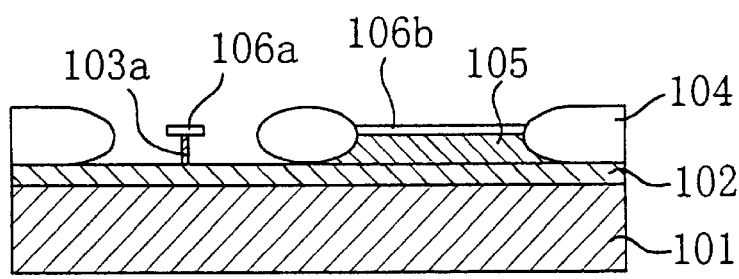
FIG. 5 is a sectional view for showing a step of forming a thin silicon plate by wet-etching the n-type Si layer in the manufacturing procedures for the semiconductor device of the first embodiment.

Then, in the procedure shown in FIG. 5, the exposed surface of the n-type Si layer 103a is allowed to be in contact with a mixed solution including ethylenediamine, pyrocatechol and water at a temperature of 85° for approximately 30 minutes. Since the mixed solution is a crystal anisotropic etching solution, silicon is very rapidly dissolved when a surface apart from the {111} oriented surface is in contact with this mixed solution. Accordingly, the n-type Si layer 103a results in remaining as a thin silicon plate having two side faces vertical to the {111} oriented surface, i.e., the surface of the substrate. The silicon plate has a thickness of approximately 10 nm. On the other hand, the silicon oxide film is scarcely etched through this etching procedure, and hence, the thicknesses of the mask oxide film 106a and the gate oxide film 106b are scarcely changed. The relationship between the plan shape of the mask oxide film 106a and the thickness of the n-type Si layer 103a will be described below.

Figure 6:
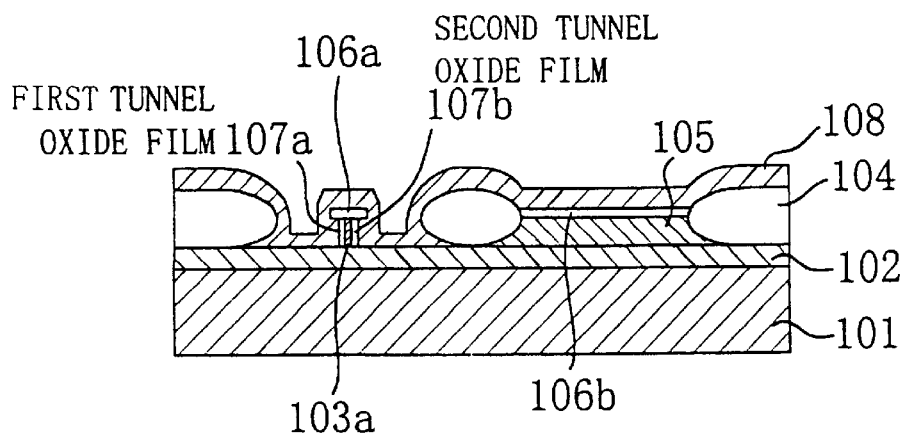
FIG. 6 is a sectional view for showing a step of depositing a polysilicon film in the manufacturing procedures for the semiconductor device of the first embodiment.

Next, in the procedure shown in FIG. 6, the side faces of the n-type Si layer 103a in the shape of the thin silicon plate are oxidized, thereby forming first and second tunnel oxide films 107a and 107b on the side faces of the n-type Si layer 103a. Then, a polysilicon film 108 is deposited on the entire surface of the substrate. Furthermore, phosphorus is diffused in the polysilicon film 108 by using $POCl_3$ or the like, so as to change the polysilicon film 108 into a high concentration n-type film.

Figure 7:
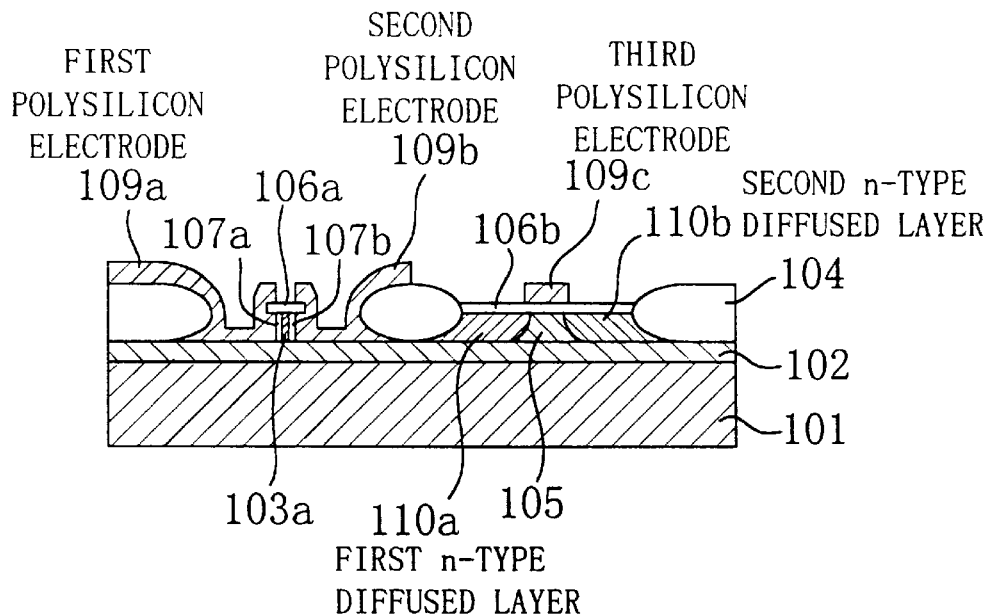
FIG. 7 is a sectional view for showing a step of forming three polysilicon electrodes by patterning the polysilicon film in the manufacturing procedures of the semiconductor device of the first embodiment.

Then, in the procedure shown in FIG. 7, the polysilicon film 108 is patterned by the photolithography and the dry etching, thereby forming first through third polysilicon electrodes 109a through 109c. Among the three polysilicon electrodes 109a through 109c, the first and second polysilicon electrodes 109a and 109b are adjacent to the tunnel oxide films 107a and 107b, respectively, extend over the mask oxide film 106a, the buried oxide film 102 and the isolation oxide film 104, and are separated from each other on the mask oxide film 106a. Also, the third polysilicon electrode 109c functions, on the gate oxide film 106b, as a gate electrode of the MOS semiconductor element.

Furthermore, by using the isolation oxide film 104 and the polysilicon electrodes 109a through 109c as masks, phosphorus or arsenic ions are implanted, thereby forming first and second n-type diffused layers 110a and 110b, working as source/drain regions, in a part of the p-type Si layer 105. In this ion implantation, a mask using a photoresist can be adopted if necessary. Also, in forming the n-type diffused layers 110a and 110b, sidewalls can be formed on the side faces of the third polysilicon electrode 109c working as the gate electrode, so as to obtain a MOS semiconductor element having the LDD structure.

Figure 8:
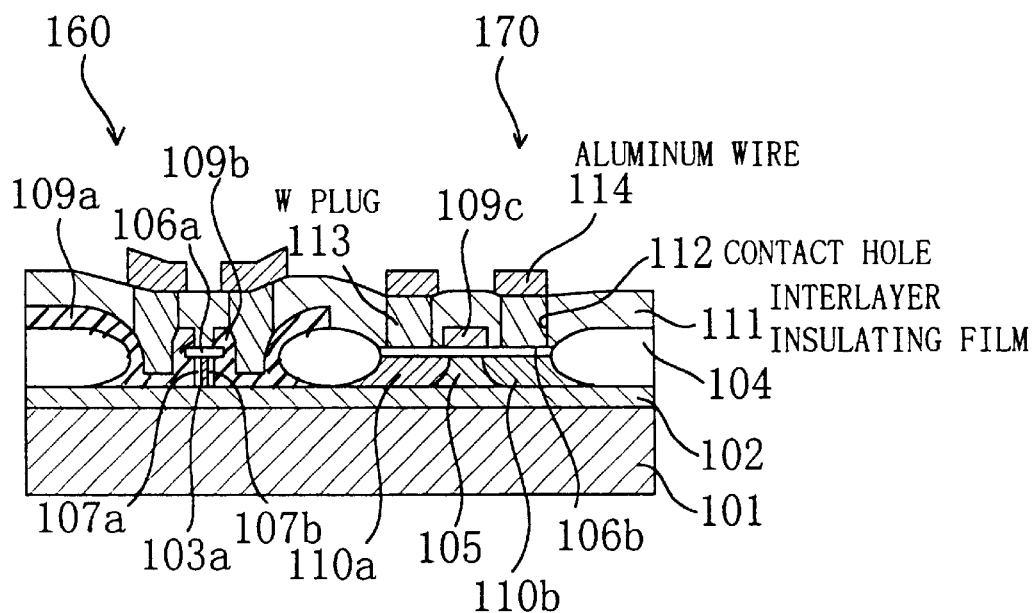
FIG. 8 is a sectional view for showing an ultimate step of forming a resonance tunnel diode and a MOS semiconductor element in the manufacturing procedures for the semiconductor device of the first embodiment.

Next, in the procedure shown in FIG. 8, an interlayer insulating film 111 is formed on the substrate, and then, contact holes 112 respectively reaching the polysilicon electrodes 109a and 109b and the n-type diffused layers 110a and 110b are formed in the interlayer insulating film 111. After each contact hole 112 is filled with tungsten (W), so as to form a W plug 113, an aluminum wire 114 connected with each W plug 113 is formed by the photolithography and the dry etching.

Through the aforementioned procedures, a $Si/SiO_2$ type resonance tunnel diode, that is, a non-linear element, and a MOS semiconductor element are respectively formed in two areas insulated from each other by the isolation oxide film 104. Specifically, the $Si/SiO_2$ type resonance tunnel diode includes the n-type Si layer 103a in the shape of the thin silicon plate, i.e., a very thin semiconductor film, the first and second tunnel oxide films 107a and 107b formed on the side faces of the n-type Si layer 103a, and the first and second polysilicon electrodes 109a and 109b respectively working as electrodes on the outer faces of the tunnel oxide films 107a and 107b. On the other hand, the MOS semiconductor element includes the third polysilicon electrode 109c working as the gate electrode, the gate oxide film 106b, the two n-type diffused layers 110a and 110b working as the source/drain regions, and the p-type Si layer 105 working as a channel region.

Accordingly, the mask oxide film 106a working as a mask insulating film for forming the Si/SiO$_2$ type resonance tunnel diode and the gate oxide film 106b of the MOS semiconductor element can be simultaneously formed by the manufacturing method of this embodiment. In addition, the first and second polysilicon electrodes 109a and 109b of the resonance tunnel diode and the gate electrode 109c of the MOS semiconductor element can be formed in the same procedure by patterning the same polysilicon film 108. In this manner, the resonance tunnel diode can be formed by using a single-layer polysilicon process, which is used in manufacturing a general MOS semiconductor device. In other words, this embodiment provides a method of manufacturing a semiconductor device comprising a Si/SiO$_2$ type resonance tunnel diode and a MOS semiconductor element at a practical manufacturing cost.

The n-channel semiconductor element alone is formed as the MOS semiconductor element in this embodiment, but a p-channel semiconductor element can be easily formed by changing the conductivity types of the impurities injected into the high concentration impurity diffused layers working as the channel region and the source/drain regions and optimizing the conditions for the impurity ion implantation and the annealing. Furthermore, it goes without saying that a CMOS semiconductor element including both an n-channel semiconductor element and a p-channel semiconductor element can be formed.

In the procedure shown in FIG. 4, a mask pattern having projections and recesses at different portions on the respective sides in a plan view is used as the mask pattern of the mask oxide film 106a (mask insulating film) for exposing a part of the n-type Si layer 103a through the photolithography and the dry etching in this embodiment. Also, a rectangular mask pattern as is described in Japanese Laid-Open Patent Publication No. 07-312419 can be used. The mask pattern will now be described in detail.

Figure 12A:
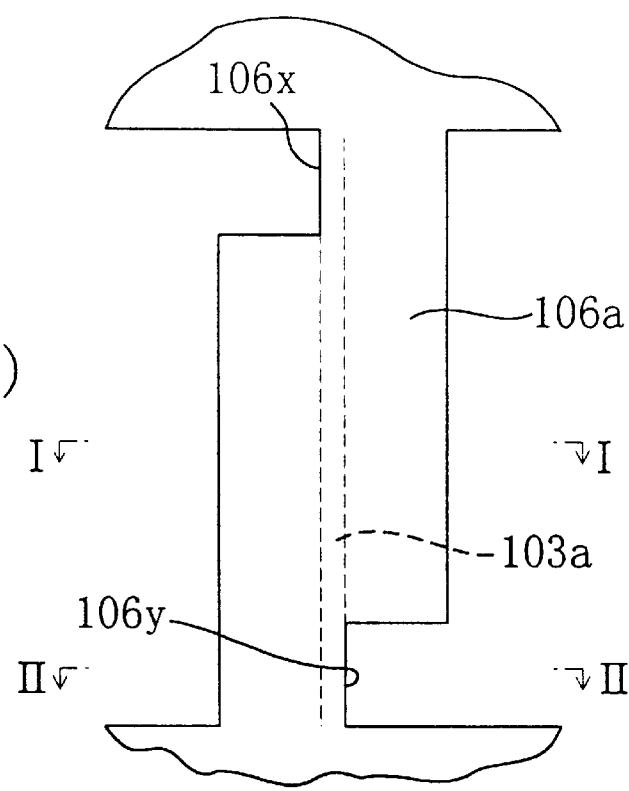
FIG. 12(a) is a plan view of the mask oxide film and the etched n-type Si layer used in the manufacturing procedures of the first embodiment.
Figure 12B:
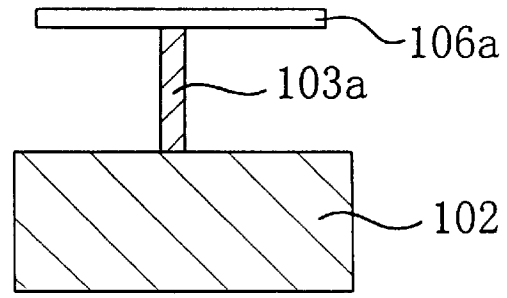
FIG. 12(b) is a sectional view taken on line I—I of FIG. 12(a) and FIG. 12(c) is a sectional view taken on line II—II of FIG. 12(a)
Figure 12C:
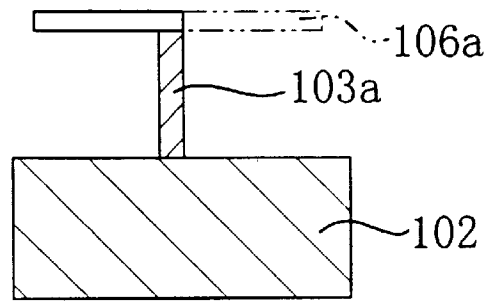

FIGS. 12(a) through 12(c) illustrate the shape of the mask oxide film 106a used as the etching mask in this embodiment, wherein FIG. 12(a) is a plan view thereof, FIG. 12(b) is a sectional view taken on line I—I of FIG. 12(a) and FIG. 12(c) is a sectional view taken on line II—II of FIG. 12(a). As is shown in FIGS. 12(a) through 12(c), the mask oxide film 106a is in the shape of a rectangular oxide film provided with two cut portions 106x and 106y. The cut portions 106x and 106y are patterned so that the innermost faces thereof can be substantially parallel to the {111} oriented surface of the n-type Si layer 103a.

When a completely rectangular etching mask, which has no cut portion as those of this embodiment, is used for the etching, a surface excluding the {111} oriented surface is etched very rapidly (at an etching rate approximately ten times as high as the etching rate on the {111} oriented surface). Therefore, the n-type Si layer 103a is etched downward from its exposed surface at a high speed but is hardly etched sideways. Therefore, the n-type Si layer 103a can be etched into a shape corresponding to merely a portion below the etching mask, i.e., a rather thick plate shape, in a very short period of time. However, the {111} oriented surface gradually recedes sideways thereafter, and ultimately the n-type Si layer 103a attains a thin plane shape with a thickness in accordance with the etching time.

In contrast, when the mask oxide film 106a having the shape as is shown in FIG. 12(a) is used for the etching with the aforementioned mixed solution, the n-type Si layer 103a is etched also from portions corresponding to the cut portions 106x and 106y. When portions of the n-type Si layer 103a exposed in the cut portions 106x and 106y are etched downward, the surface apart from the {111} oriented surface can be exposed in other portions of the n-type Si layer 103a below a part without a cut portion of the mask oxide film 106a. Therefore, the etching can be effected very rapidly. When the side faces of the n-type Si layer 103a accord with the innermost faces of the cut portions 106x and 106y, the {111} oriented surface alone is exposed, and hence the etching rate suddenly becomes low. In this manner, since the mask oxide film 106a is provided with the cut portions 106x and 106y, the n-type Si layer 103a can attain the very thin plate shape having two side faces substantially according to the innermost faces of the cut portions 106x and 106y.

Thus, the ultimately formed n-type Si layer 103a can attain the shape of a thin silicon plate having two planes (which are the {111} oriented surface of the n-type Si layer 103a) parallel to the innermost faces of the cut portions 106x and 106y as its side faces. In other words, a distance between the innermost faces of the cut portions 106x and 106y determines the ultimate thickness of the n-type Si layer 103a. When the mask oxide film 106a having such projections and recesses is used, the thickness of the n-type Si layer 103a can be controlled not by the etching time but by the shape of the mask insulating film in the procedure for patterning the n-type Si layer 103a into the thin silicon plate shape by using the crystal anisotropic etching solution. Thus, the controllability can be remarkably improved. As a result, it was found through experiments that a silicon plate with an arbitrary thickness ranging between 2 nm and 10 nm can be accurately formed. Accordingly, a desired resonance tunnel effect can be achieved at high accuracy.

When the innermost faces of the cut portions are not parallel to the {111} oriented surface of the n-type Si layer 103a, the thickness of the n-type Si layer 103a is substantially determined by a distance between innermost points among contact points between the {111} oriented surface and the side faces of the cut portions.

Figure 13:
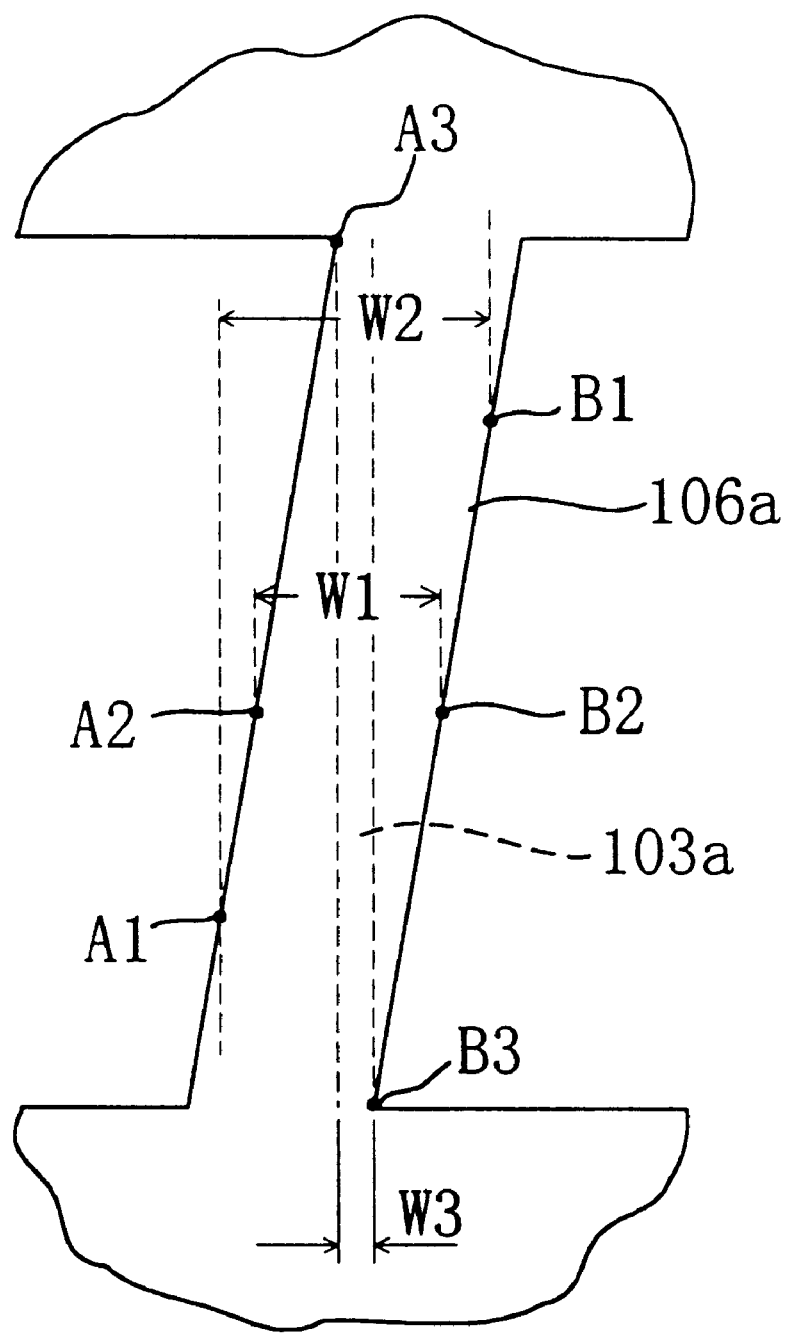
FIG. 13 is a plan view of a modification of the mask oxide film used in the manufacturing procedures of the first embodiment.

However, even when the mask insulating film (mask oxide film 106a) of this embodiment does not have the shape as shown in FIG. 12(a), the thickness of the thin n-type Si layer 103a can be controlled by the shape of the mask insulating film. FIG. 13 is a plan view for showing an exemplified shape of the mask oxide film 106a adopted for this purpose. In using the mask oxide film 106a having the shape as shown in FIG. 13, when the mask oxide film 106a is formed so as to attain a predetermined positive value as the smallest width (W3) among widths W1 through W3 between two arbitrary intersections (such as intersections A1 through A3 and B1 through B3) between the side faces of the mask oxide film 106a and the {111} oriented surface of the n-type Si layer 103a, i.e., the crystal surface having etching resistance against the etching solution, the ultimate thickness of the n-type Si layer 103a can be substantially equal to the width W3. However, when the smallest width W3 has a negative value, the n-type Si layer 103a can be totally etched before attaining the plate shape.

A silicon nitride film or a silicon nitrided oxide film can be used in stead of the tunnel oxide films 107a and 107b. Also, the gate insulating film of the semiconductor element and the etching mask for the n-type Si layer 103a of the resonance tunnel diode can be formed out of a silicon nitride film or a silicon nitrided oxide film instead of the silicon oxide film.

(Embodiment 2)

Figure 9:
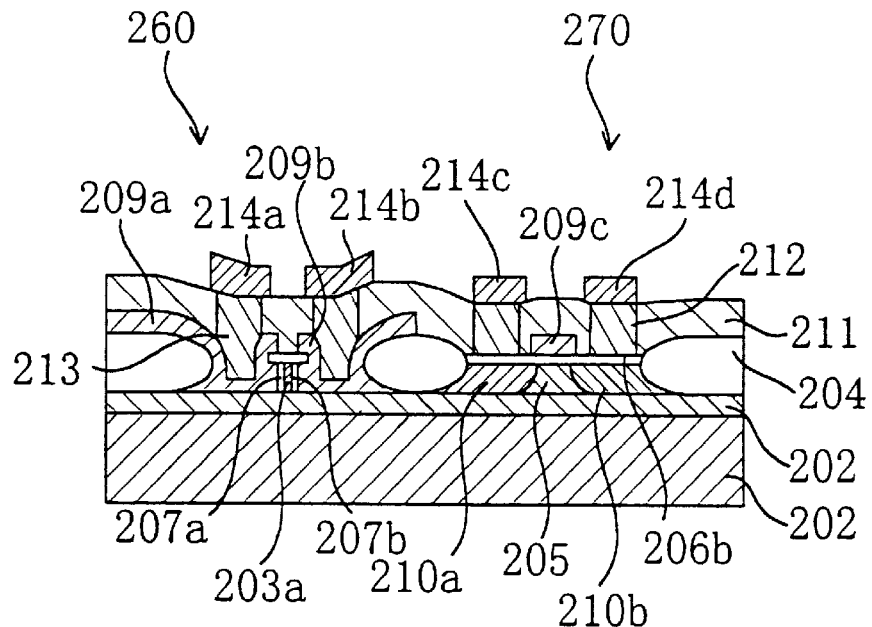
FIG. 9 is an enlarged sectional view of a part of a semiconductor device according to a second embodiment.

A second embodiment of the invention will now be described with reference to FIGS. 9 through 11. FIG. 9 is an enlarged sectional view of a part of a semiconductor device of this embodiment, FIG. 10 is a circuit diagram of a bistable memory cell including the semiconductor device of this embodiment and FIG. 11 is a operational characteristic diagram of the bistable memory cell.

As is shown in FIG. 9, a Si/SiO$_2$ type resonance tunnel diode 260 includes an n-type Si layer 203a in the shape of a thin silicon plate with a thickness of approximately 5 nm, first and second tunnel oxide films 207a and 207b each with a thickness of approximately 1.5 nm formed respectively on the side faces of the n-type Si layer 203a, and first and second polysilicon electrodes 209a and 209b formed on the outer faces of the tunnel oxide films 207a and 207b. The n-type Si layer 203a works as a very thin semiconductor film, and the tunnel oxide films 207a and 207b formed on the side faces of the n-type Si layer 203a work as energy barrier films. The first and second polysilicon electrodes 209a and 209b are connected with first and second aluminum wires 214a and 214b, respectively through W plugs 213, so as to work as external voltage supply sources.

On the other hand, a MOS semiconductor element 270 includes a third polysilicon electrode 209c working as a gate electrode, a gate oxide film 206b, two p-type diffused layers 210a and 210b working as source/drain regions, and an n-type Si layer 205 working as a channel region. The p-type diffused layers 210a and 210b are connected with third and fourth aluminum wires 214c and 214d, respectively through the W plugs 213. This MOS semiconductor element is a so-called p-channel MOS semiconductor element, and is a depletion type pMOS semiconductor element whose threshold voltage is controlled so as to cause a current between the source and the drain even when the gate voltage is 0 V.

Figure 10:
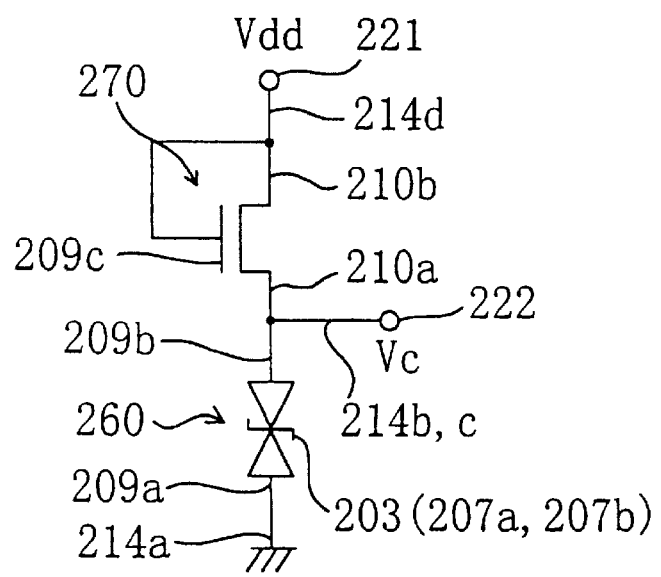
FIG. 10 is a circuit diagram of a bistable memory cell including the semiconductor device of the second embodiment.
Figure 11:
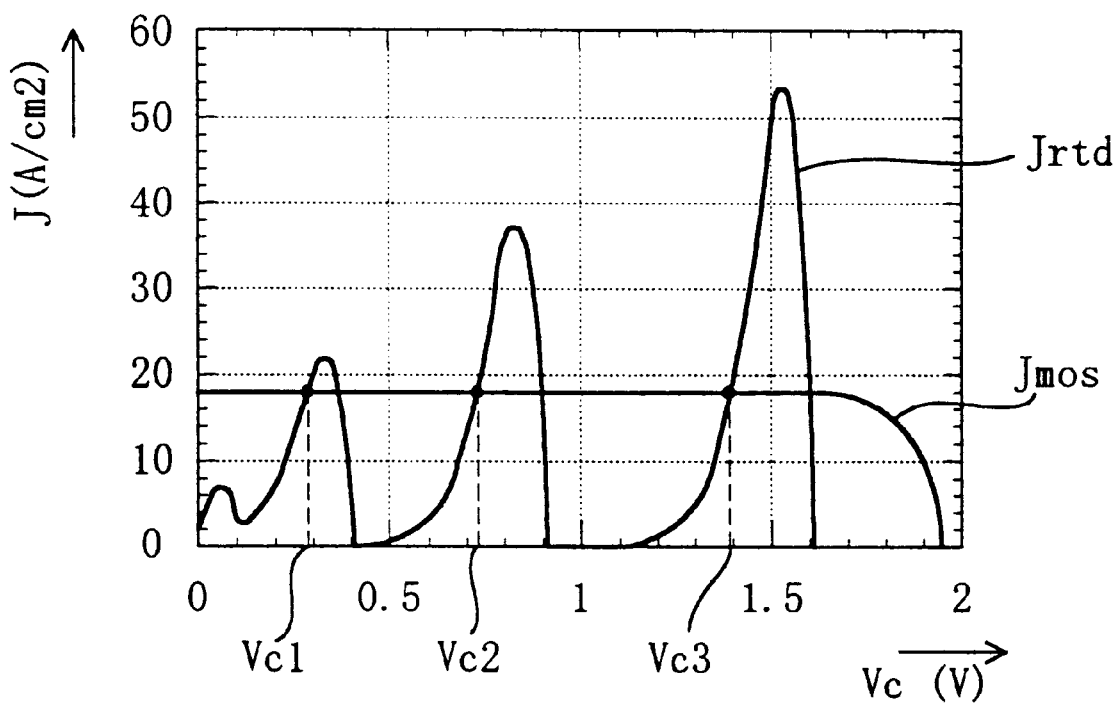
FIG. 11 is a voltage-current characteristic diagram of the bistable memory cell including the semiconductor device of the second embodiment.

As is shown in FIG. 10, respective parts of the depletion type PMOS semiconductor element 270 and the resonance tunnel diode 260 are connected as follows, thereby constituting the bistable memory cell.

The third polysilicon electrode 209c working as the gate electrode of the MOS semiconductor element 270 is connected with the n-type diffused layer 210b working as the source electrode through the W plug 212 and the fourth aluminum wire 214d. The second and third aluminum wires 214b and 214c are short-circuited, and the n-type diffused layer 210a working as the drain electrode is connected with the second polysilicon electrode 209b of the resonance tunnel diode 260 through the W plug 213 and the second and third aluminum wires 214b and 214c. The first polysilicon electrode 209a of the resonance tunnel diode 260 is connected with the first aluminum wire 214a through the W plug 213.

Now, the operation of the circuit of FIG. 10 will be described. As is shown in FIG. 10, a power terminal 221 connected with the fourth aluminum wire 214d is supplied with a positive supply voltage Vdd, a control terminal 222 connected with the second and third aluminum wires 214b and 214c is supplied with a control voltage Vc of approximately 0 through 2 V, and the first aluminum wire 214a is grounded. FIG. 11 shows a voltage-current characteristic curve Jrtd of the resonance tunnel diode obtained by changing the control voltage Vc applied to the control terminal 222 in a range between 0 and 2.0 V, and a voltage-current characteristic curve Jmos of the MOS semiconductor element used as a load. The stable point of the circuit of FIG. 10 is a point where the voltage-current characteristic curve Jrtd of the resonance tunnel diode crosses the voltage-current characteristic curve Jmos of the MOS semiconductor element and additionally the characteristic curves Jrtd and Jmos have different gradient signs (namely, a crossing point where both the characteristic curves Jrtd and Jmos have positive or negative gradient cannot be a stable point). Therefore, it is understood that the circuit is stable when the control voltage Vc at the control terminal 222 has any of three potentials Vc1, Vc2 and Vc3 shown in FIG. 11. Accordingly, the circuit can be used as a ternary bistable memory cell by applying one of the three potentials Vc1, Vc2 and Vc3 to the control terminal 222 as a write voltage.

In this manner, when a resonance tunnel diode and a MOS semiconductor element are formed on the same semiconductor substrate as described in this embodiment, a binary or milti-valued bistable memory cell can be formed.

The p-channel semiconductor element alone is used as the MOS semiconductor element in this embodiment, but an n-channel MOS semiconductor element can be used in accordance with a circuit configuration. Furthermore, it goes without saying that a CMOS semiconductor element including both an n-channel semiconductor element and a p-channel semiconductor element can be formed.

(Embodiment 3)

Now, a hot electron transistor according to a third embodiment of the invention will be described with reference to FIGS. 14 and 15(a) through 15(c).

Figure 14:
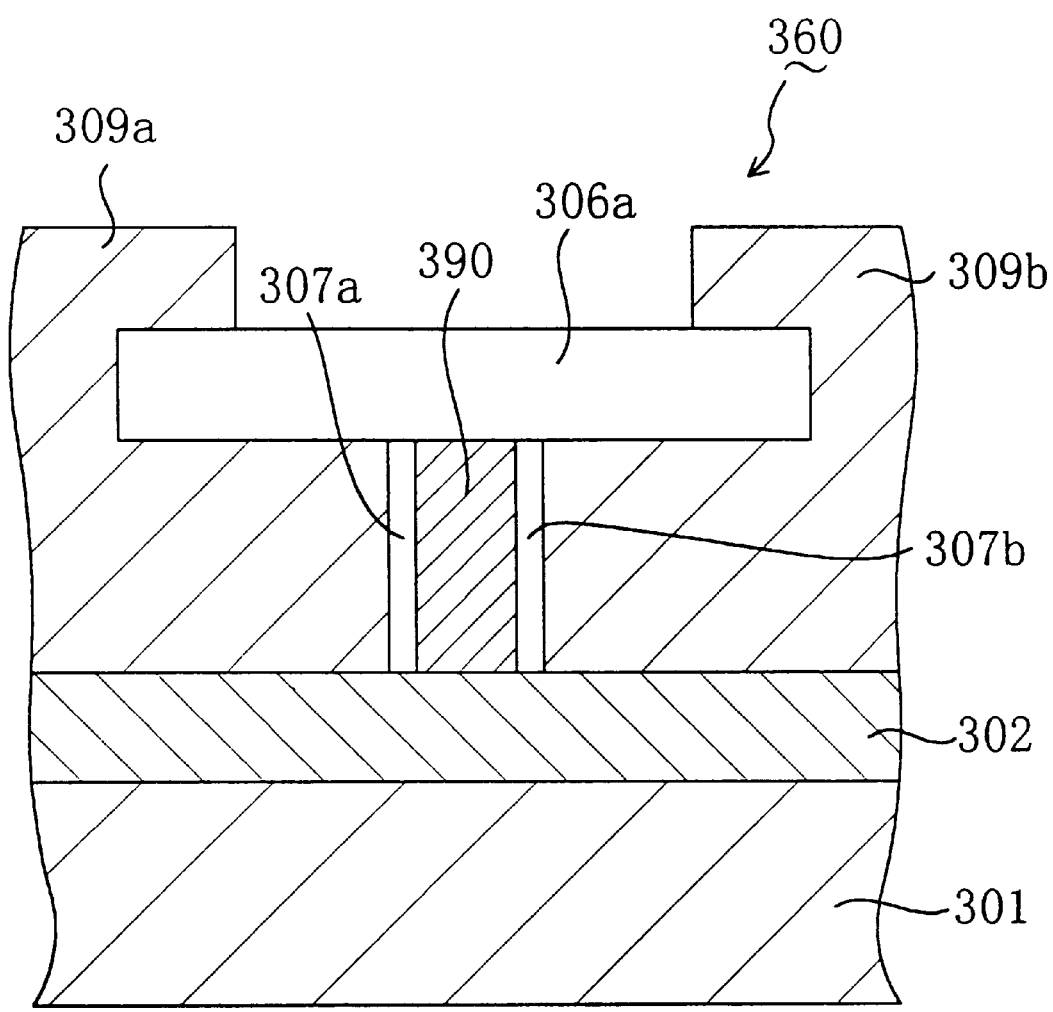
FIG. 14 is a sectional view for showing a structure of a main part of a hot electron transistor according to a third embodiment.

FIG. 14 is a partial sectional view for showing a double barrier structure portion of a hot electron transistor 360 of this embodiment. The hot electron transistor 360 of this embodiment includes a p-type Si substrate 301, a buried oxide film 302 formed on the p-type Si substrate 301, a p-type Si layer 390 formed on the buried oxide film 302 as a silicon fine structure with a rectangular section, tunnel oxide/energy barrier films 307a and 307b formed at both sides of the p-type Si layer 390, and a mask oxide film 306a with a thickness of approximately 10 nm formed on the p-type Si layer 390.

Also, first and second polysilicon electrodes 309a and 309b including a p-type impurity are formed adjacent to the tunnel oxide/energy barrier films 307a and 307b, respectively. The first and second polysilicon electrodes 309a and 309b extend over the buried oxide film 302 and an isolation oxide film 304 so as to be separated from each other on the mask oxide film 306a.

The double barrier structure is obtained by the p-type Si layer 390 formed as the silicon fine structure with a rectangular section and the tunnel oxide/energy barrier films 307a and 307b formed at both sides thereof. Although not shown in FIG. 14, a pad region with a large area is formed to be communicated with the p-type Si layer 390 because it is necessary to provide a control voltage signal to the p-type Si layer 390, and the pad region is provided with a contact extending from an upper wire. This is a difference between the resonance tunnel diode of the first embodiment, where no signal is supplied to the n-type Si layer 103a, and the hot electron transistor of this embodiment.

In the hot electron transistor 360 of this embodiment, the principal surface of the p-type Si substrate 301 is the {110} oriented surface. The facet direction of the p-type Si substrate 301 accords with the <112> orientation, and FIG. 14 shows the section perpendicular to the facet direction. The side faces of the p-type Si layer 390 are the (111) oriented surfaces parallel to each other, and extend vertically to the surfaces of the silicon substrate 301 and the buried oxide film 302. The p-type Si layer 390 has a thickness of 10 nm or less, so that carriers having tunneled through the tunnel oxide film 307a from the first polysilicon electrode 309a can move to the second polysilicon electrode 309b at high efficiency. Also, the p-type Si layer 390 preferably has a vertical thickness of approximately 100 through 200 nm. The tunnel oxide/energy barrier films 307a and 307b have a thickness of 2 through 4 nm, and preferably of approximately 3 nm.

Figure 16:
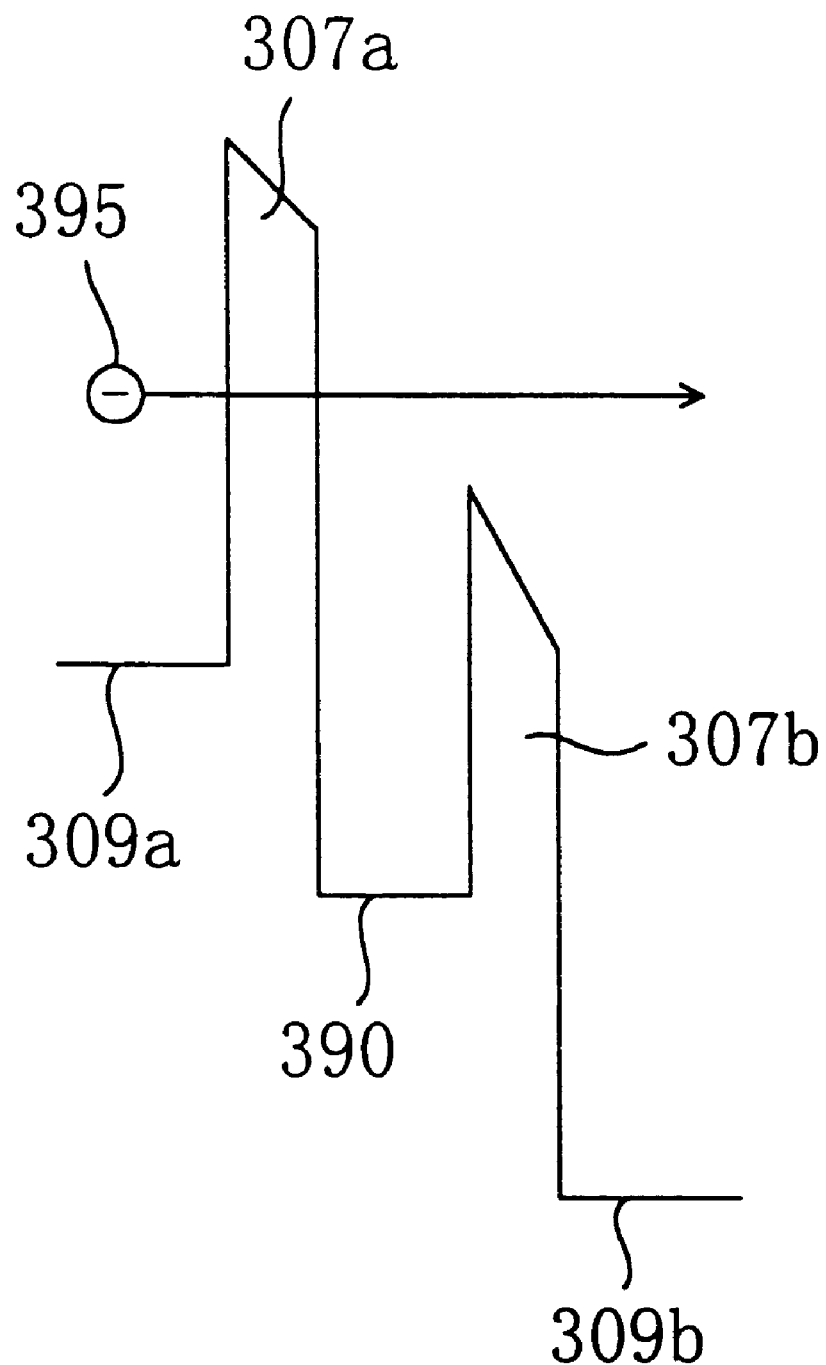
FIG. 16 is a band diagram for showing the operation of the hot electron transistor of the third embodiment.

Now, the operational principle of a hot electron transistor will be briefly described with reference to FIG. 16. The hot electron transistor has the "double barrier structure" as described above in which the p-type Si layer 390 with a very small thickness sufficient to cause the quantum effect is sandwiched between the tunnel oxide/energy barrier films 307a and 307b and the first and second polysilicon electrodes 309a and 309b are formed on the outer faces of the tunnel oxide/energy barrier films 307a and 307b. When a positive voltage on the basis of the p-type Si layer 390 is applied between the p-type first polysilicon electrode 309a and the p-type Si layer 390 in this structure, hot electrons 395 within the first polysilicon electrode 309a tunnel through the tunnel oxide film 307a to be injected into the p-type Si layer 390. The injected electrons 395 lose their energy owing to the lattice vibration or the like, but when the p-type Si layer 390 is thin, a large proportion of the electrons 395 pass through the p-type Si layer 390. When the energy barrier film 307b is formed in contact with the p-type Si layer 390, the hot electrons 395 alone can pass through the energy barrier film 307b to reach the second polysilicon electrode 309b at the opposite side. The power can be amplified by providing structural means for making the lateral thickness of the p-type Si layer 390 be 10 nm or less and making a current flowing through the energy barrier film 307b into the second polysilicon electrode 309b larger than a current flowing to the p-type Si layer 390 but not passing through the energy barrier film 307b. In other words, in the case of adopting this structure, it is possible to obtain a hot electron transistor having a power amplifying property similar to an npn bipolar transistor. In addition, this element does not include a pn junction as the bipolar element, this element can be advantageously normally operated at a low temperature. Moreover, the size of this element can be advantageously refined to the same extent as a MOSFET.

Alternatively, when the p-type Si layer 390 is replaced with an n-type Si layer with a lateral thickness of 10 nm or less and a p-type impurity is diffused in the polysilicon electrodes 309a and 309b, a hot electron transistor similar to a pnp bipolar transistor can be formed.

Now, the manufacturing procedures for the hot electron transistor 360 of this embodiment will be described with reference to FIGS. 15(a) through 15(c).

Figure 15A:
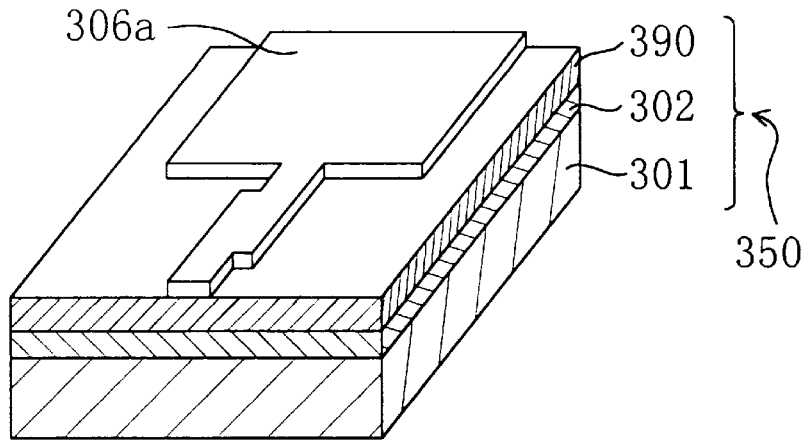
FIGS. 15(a) through 15(c) are perspective views for showing manufacturing procedures for the hot electron transistor of the third embodiment.

First, as is shown in FIG. 15(a), on an SOI substrate 350 with the (110) oriented surface including the silicon substrate 301, the buried oxide film 302 and the p-type Si layer 390 is formed the mask oxide film 306a having a narrow portion and a wide portion. The narrow portion of the mask oxide film 306a is in the same shape as the mask oxide film 106a shown in FIG. 12(a). Specifically, the narrow portion of the mask oxide film 306a extends along the {111} oriented surface of the p-type Si layer 390 and has two cut portions. In this embodiment, the mask oxide film 306a is obtained by forming a thermal oxide film with a thickness of 100 nm through annealing at a temperature of 900° for 54.5 minutes and patterning the resultant oxide film. In a portion where the mask oxide film 306a is not formed, the surface of the p-type Si layer 390 is exposed.

Figure 15B:
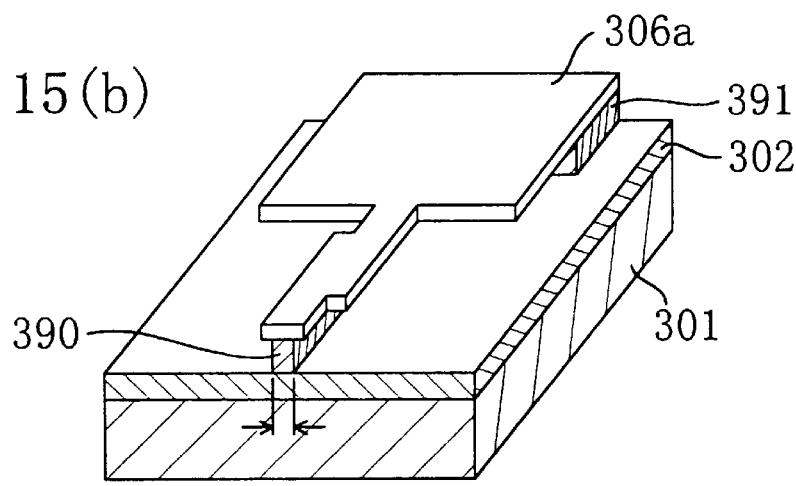

Next, as is shown in FIG. 15(b), the p-type Si layer 390 is subjected to the crystal anisotropic etching by using a mixed solution including ethylenediamine ($NH_2(CH) NH$ ), pyrocatechol ($C_6H_4(OH)$) and pure water as an etching solution. Since the mixed solution is a crystal anisotropic etching solution, silicon can be very rapidly dissolved when a surface apart from the {111} oriented surface is in contact with the mixed solution. In this embodiment, similarly to the first embodiment, when the side faces of the p-type Si layer 390 accord with the innermost faces of the cut portions of the mask oxide film 306a, the {111} oriented surface alone is exposed, and hence, the etching rate suddenly becomes low. In this manner, the p-type Si layer 390 can be formed into a very thin plate shape having two side faces substantially according to the innermost faces of the cut portions of the mask oxide film 306a. In this embodiment, the lateral thickness of the p-type Si layer 390 is made to be approximately 10 nm through the crystal anisotropic etching. Also, below the wide portion of the mask oxide film 306a, a pad region 391 of p-type monocrystalline silicon communicated with the p-type Si layer 390 remains.

Figure 15C:
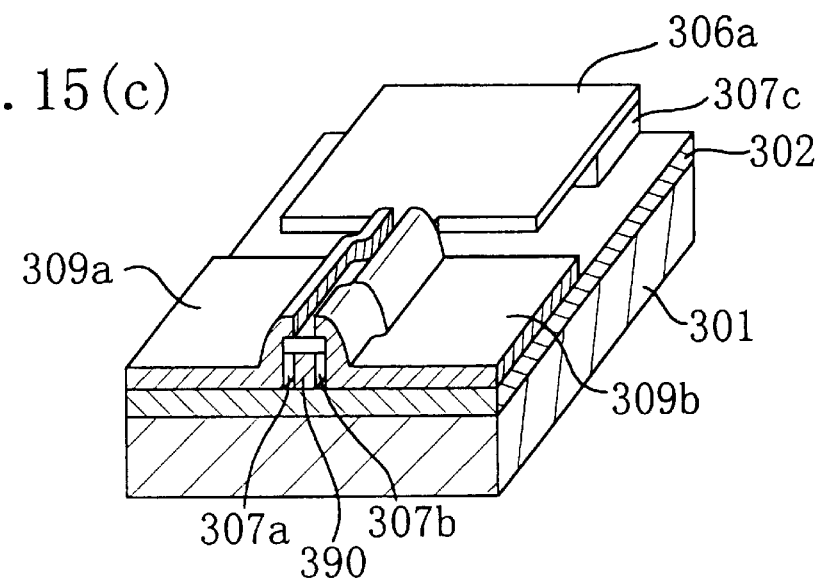

Then, as is shown in FIG. 15(c), through the thermal oxidation at a temperature ranging between 700° C. and 1000° C., a thermal oxide film with a thickness of 2 through 4 nm and preferably of 3 nm is formed. Through this procedure, the tunnel oxide/energy barrier films 307a and 307b are formed at both sides of the p-type Si layer 390, and a protection oxide film 307c is formed on a side face of the pad region 391. The thickness of the p-type Si layer 390 is further decreased for forming the oxide film, resulting in a thickness smaller than 10 nm, for example, approximately 7 through 8 nm. Thereafter, a polysilicon film is formed on the entire surface of the substrate, an n-type impurity such as $POCl_3$ is diffused in the polysilicon film, and the polysilicon film is patterned, thereby forming the first and second polysilicon electrodes 309a and 309b adjacent to the tunnel oxide/energy barrier films 307a and 307b.

In this manner, through the manufacturing procedures of this embodiment, the very thin p-type Si layer 390 with the (111) oriented surface having flatness at the atom level and free from a processing damage can be formed by utilizing the crystal anisotropic etching of silicon. Also, the pad region 391 communicated with the p-type Si layer 390 can be easily formed, so that the p-type Si layer 390 can be smoothly supplied with a control voltage signal.

Furthermore, in the hot electron transistor of this embodiment, the p-type Si layer 390 is formed so as to extend vertically on the principal surface of the silicon substrate 301. Since the p-type Si layer 390 thus extends also vertically to the surface of the silicon substrate 301, an external force can hardly damage the p-type Si layer 390. Moreover, the mask oxide film 306a above the p-type Si layer 390 can be more rigidly supported.

The thermal oxide film is used as the mask oxide film 306a in this embodiment, but the thermal oxide film can be replaced with a nitride film or a chromium film. Furthermore, the mixed solution including ethylenediamine is used as the etching solution in the crystal anisotropic etching in this embodiment, but a mixed solution of hydrazine, isopropyl alcohol and pure water or an aqueous solution of potassium hydroxide can be used instead. In addition, the oxide films 307a and 307b can be replaced with a nitrided oxide film, a nitride film, a SiC film or a SiGe film adoptable as an energy barrier.

It is noted that since the wide portion of the mask oxide film 306a shown in FIG. 15(a) through 15(c) is formed on the isolation, the hot electron transistor can be formed at a high density.

Alternatively, the following structure is adoptable: On a substrate 301 with the (001) oriented surface, a silicon thin plate 310 is formed parallel or vertically to the <110> crystal orientation. Through the crystal anisotropic etching, the silicon thin plate 310 is formed to be inclined to the surface of the substrate 301.

(Embodiment 4)

A fourth embodiment of the invention will now be described. In this embodiment, a manufacturing method for forming the hot electron transistor of the third embodiment and a MOS transistor on the same substrate will be described with reference to FIGS. 17 through 24, which are sectional views for showing manufacturing procedures for a semiconductor device of this embodiment.

Figure 17:
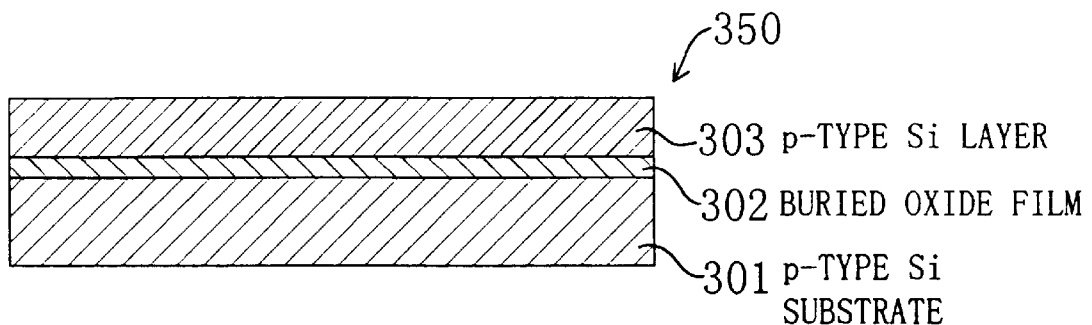
FIG. 17 is a sectional view for showing a step of forming an SOI substrate in manufacturing procedures for a semiconductor device according to a fourth embodiment.

First, in the procedure shown in FIG. 17, an SOI substrate 350 is formed by, for example, implanting oxygen ions in a p-type silicon substrate 301. The SOI substrate 350 includes the p-type Si substrate 301, a buried oxide film 302 formed on the p-type Si substrate 301 and a p-type Si layer 303 formed on the buried oxide film 302. At least the p-type Si layer 303 in the SOI substrate 350 has the {110} oriented surface as the principle surface. The facet direction of the p-type Si substrate 301 accords with the <121> orientation, and FIGS. 17 through 24 show the section perpendicular to the facet direction. The p-type Si layer 303 of this embodiment has a vertical thickness of approximately 100 through 200 nm.

Figure 18:
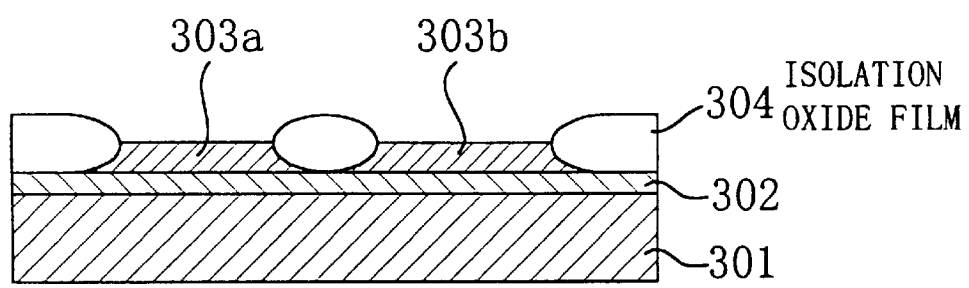
FIG. 18 is a sectional view for showing a step of forming an isolation oxide film in the manufacturing procedures for the semiconductor device of the fourth embodiment.

Next, in the procedure shown in FIG. 18, an isolation oxide film 304 is formed in a part of the p-type Si layer 303 by the selective oxidation or the like, thereby partitioning the p-type Si layer 303 into isolated areas 303a, 303b, etc. The thickness of the isolation oxide film 304 can be approximately the same as or twice as large as the thickness of the p-type Si layer 303 so that the respective p-type Si layers 303a, 303b, etc. can be electrically insulated from one another.

Figure 19:
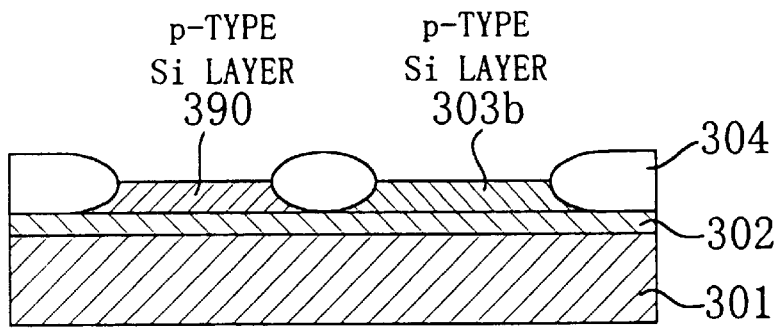
FIG. 19 is a sectional view for showing a step of forming a p-type Si layer in the manufacturing procedures for the semiconductor device of the fourth embodiment.

Then, in the procedure shown in FIG. 19, the p-type Si layer 303a surrounded with the isolation oxide film 304 is changed into a higher concentration p-type Si layer 390 through photolithography, ion implantation and annealing. The conditions for the ion implantation and the annealing depend upon the design of the hot electron transistor to be formed. In this embodiment, boron ions are implanted under conditions of an implantation energy of 40 keV and a dose of $10^{15}/cm^2$, and the activation is effected at a temperature of 950° C. for 60 minutes.

Figure 20:
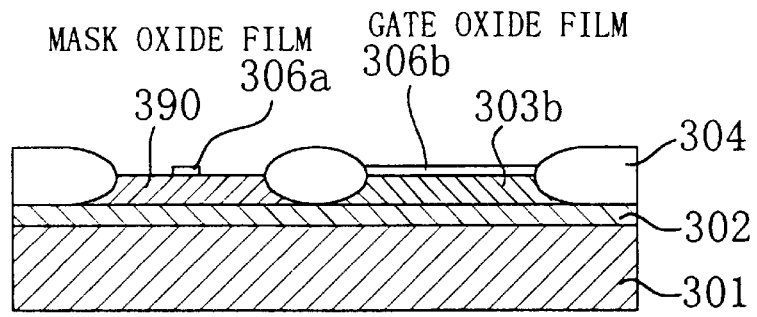
FIG. 20 is a sectional view for showing a step of forming a mask oxide film and a gate oxide film in the manufacturing procedures for the semiconductor device of the fourth embodiment.

Next, in the procedure shown in FIG. 20, the surface of the substrate is oxidized, thereby forming a mask oxide film 306a and a gate oxide film 306b each having a thickness of approximately 10 nm on the p-type Si layer 390 and the p-type Si layer 303b, respectively. The end portions of the mask oxide film 306a are removed through photolithography and dry etching, so that the mask oxide film 306a can remain merely on the center of the p-type Si layer 390. In other words, the p-type Si layer 390 is exposed at both sides of the mask oxide film 306a. At this point, the width of the mask oxide film 306a in this section is approximately 100 nm, but the width can be freely determined if occasion demands. The thickness of the mask oxide film 306a can be approximately 2 through 3 nm without causing any problem in subsequent procedures. On the other hand, the gate oxide film 306b totally remains, and hence the surface of the p-type Si layer 303b is not exposed.

Figure 21:
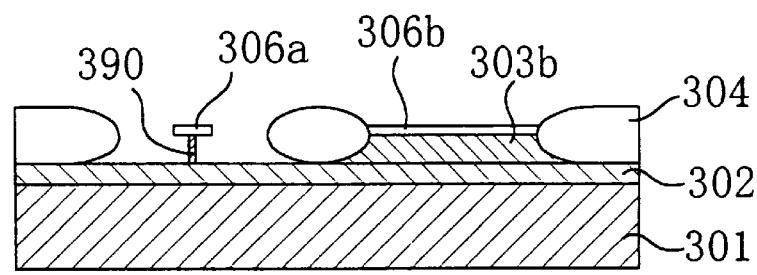
FIG. 21 is a sectional view for showing a step of forming a thin silicon plate by wet-etching the p-type Si layer in the manufacturing procedures for the semiconductor deice of the fourth embodiment.

Next, in the procedure shown in FIG. 21, the exposed surface of the p-type Si layer 390 is allowed to be in contact with a mixed solution including ethylenediamine, pyrocatechol and water at a temperature of 85° C. for approximately 30 minutes. Since the mixed solution is a crystal anisotropic etching solution, silicon can be very rapidly dissolved when a surface apart from the {111} oriented surface is in contact with the mixed solution. Therefore, the p-type Si layer 390 results in remaining as a thin silicon plate having two side faces vertical to the {111} surface, i.e., the surface of the substrate. The silicon plate has a thickness of approximately 10 nm. On the other hand, the silicon oxide film is hardly etched through this etching, and hence, the thicknesses of the mask oxide film 306a and the gate oxide film 306b are hardly changed. The relationship between the plan shape of the mask oxide film 306a and the thickness of the p-type Si layer 390 is the same as described in the first and third embodiments.

Figure 22:
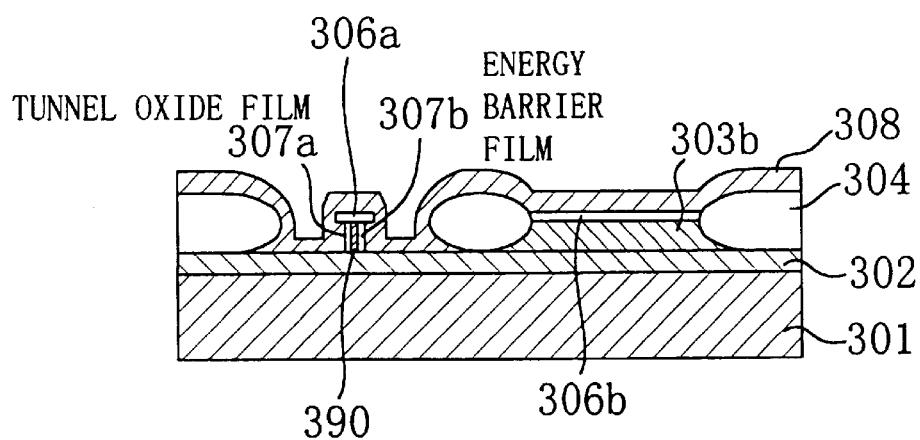
FIG. 22 is a sectional view for showing a step of depositing a polysilicon film in the manufacturing procedures for the semiconductor device of the fourth embodiment.

Then, in the procedure shown in FIG. 22, the side faces of the p-type Si layer 390 in the shape of the thin silicon plate are oxidized, thereby forming tunnel oxide/energy barrier films 307a and 307b on the side faces of the p-type Si layer 390, and a polysilicon film 308 is then deposited on the entire surface of the substrate. Phosphorus is diffused in the polysilicon film 308 by using $POCl_3$ or the like, so that the polysilicon film 308 can be changed into a high concentration n-type film.

Figure 23:
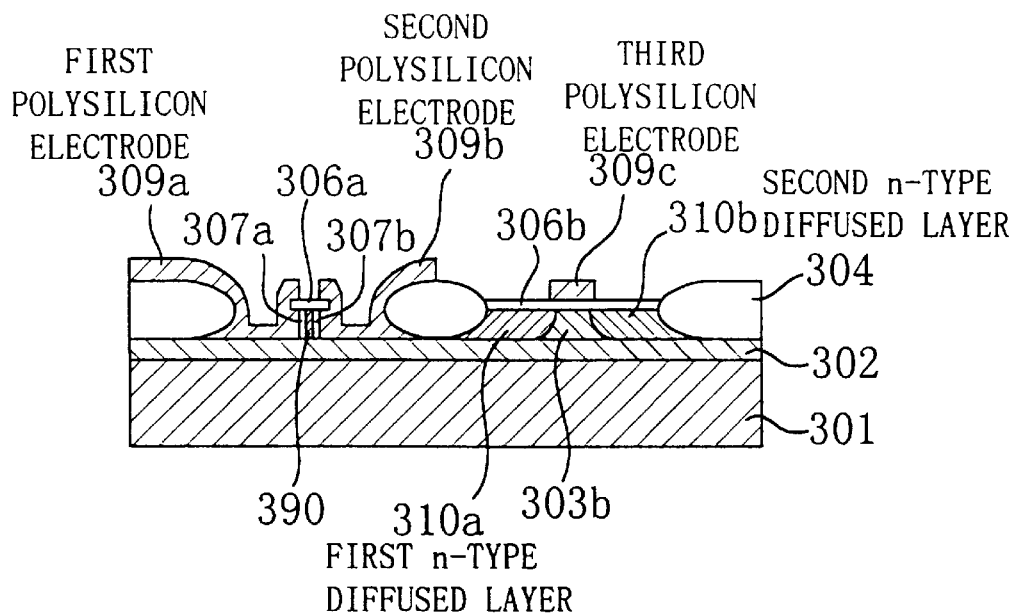
FIG. 23 is a sectional view for showing a step of forming three polysilicon electrodes by patterning the polysilicon film in the manufacturing procedures for the semiconductor device of the fourth embodiment.

Next, in the procedure shown in FIG. 23, the polysilicon film 308 is patterned by the photolithography and the dry etching, thereby forming first through third polysilicon electrodes 309a through 309c. Among these three polysilicon electrodes 309a through 309c, the first and second polysilicon electrodes 309a and 309b are adjacent to the tunnel oxide/energy barrier films 307a and 307b, respectively, extend over the mask oxide film 306a, the buried oxide film 302 and the isolation oxide film 304 and are separated from each other on the mask oxide film 306a. The third polysilicon electrode 309c works, on the gate oxide film 306b, as a gate electrode of the MOS semiconductor element.

Furthermore, by using the isolation oxide film 304 and the polysilicon electrodes 309a through 309c as masks, phosphorus ions or arsenic ions are implanted, thereby forming, in a part of the p-type Si layer 303b, first and second n-type diffused layers 310a and 310b working as source/drain regions. In this ion implantation, a mask using a photoresist can be adopted if necessary. Also, in the formation of the n-type diffused layers 310a and 310b, sidewalls can be formed on the side faces of the third polysilicon electrode 309c working as the gate electrode, so as to obtain a MOS semiconductor element with the LDD structure.

Figure 24:
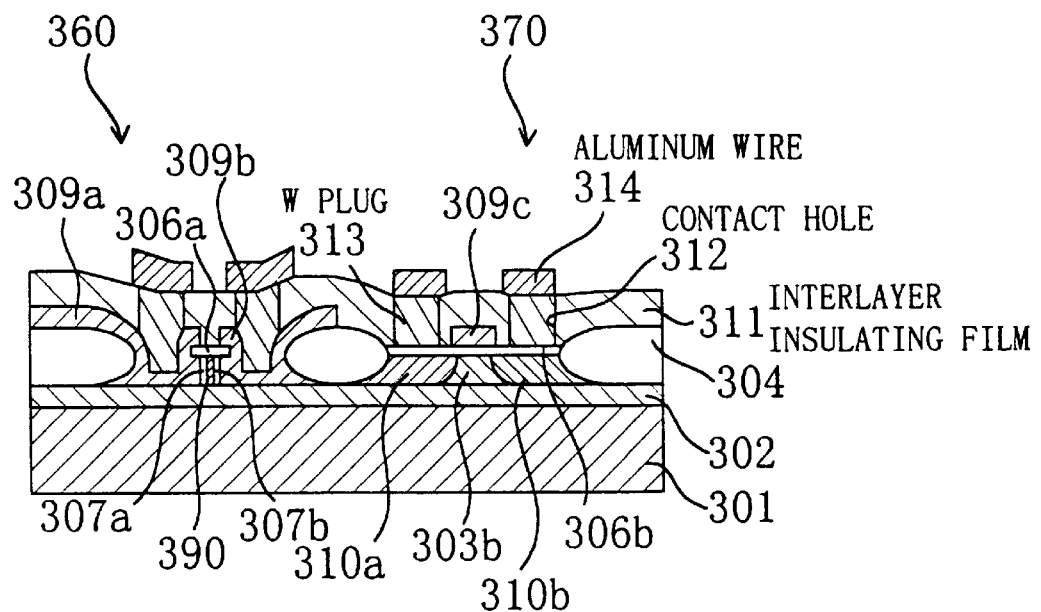
FIG. 24 is a sectional view for showing an ultimate step of forming a hot electron transistor and a MOS semiconductor element in the manufacturing procedures for the semiconductor device of the fourth embodiment.

Then, in the procedure shown in FIG. 24, an interlayer insulating film 311 is formed on the substrate, and contact holes 312 respectively reaching the polysilicon electrodes 309a and 309b and the n-type diffused layers 310a and 310b are formed in the interlayer insulating film 311. After each of the contact holes 312 is filled with tungsten (W), so as to form a W plug 313, an aluminum wire 314 connected with each W plug 313 is formed by the photolithography and the dry etching. It is noted that, in a section not shown, a contact hole and a plug for supplying a control voltage signal to the p-type Si layer 390 of the hot electron transistor 360 are also formed. For this purpose, a contact hole reaching the wide portion 391 of the p-type Si layer 390 shown in FIG. 15(b) is formed in the interlayer insulating film 311.

Through the aforementioned procedures, a $Si/SiO_2$ type hot electron transistor and a MOS semiconductor element are respectively formed in two areas insulated from each other by the isolation oxide film 304. Specifically, the $Si/SiO_2$ type hot electron transistor includes the p-type Si layer 390 in the shape of the thin silicon plate, i.e., a very thin semiconductor film, the tunnel oxide/energy barrier films 307a and 307b formed on the side faces of the p-type Si layer 390, and the first and second polysilicon electrodes 309a and 309b working as electrodes on the outer faces of the tunnel oxide/energy barrier films 307a and 307b. On the other hand, the MOS semiconductor element includes the third polysilicon electrode 309c working as the gate electrode, the gate oxide film 306b, the two n-type diffused layers 310a and 310b working as the source/drain regions, and the p-type Si layer 303b working as the channel region.

Accordingly, the mask oxide film 306a working as a mask insulating film for forming the Si/SiO$_2$ type hot electron transistor and the gate oxide film 306b of the MOS semiconductor element can be simultaneously formed in the manufacturing method of this embodiment. Also, the first and second polysilicon electrodes 309a and 309b of the hot electron transistor and the gate electrode 309c of the MOS semiconductor element can be formed in the same procedure by patterning the same polysilicon film 308. In this manner, the hot electron transistor can be formed by utilizing the single-layer polysilicon process adopted in the manufacture of a general MOS semiconductor element. Specifically, this embodiment provides a manufacturing method for manufacturing a semiconductor device including a Si/SiO$_2$ type hot electron transistor having the power amplifying function corresponding to a bipolar transistor and a MOS semiconductor element at a practical manufacturing cost. In other words, a semiconductor device which can exhibit a function corresponding to that of a BiCMOS even at a low temperature can be manufactured at a high density.

The n-channel semiconductor element alone is formed as the MOS semiconductor element in this embodiment, but a p-channel semiconductor element can be easily formed by changing the conductivity types of the impurities in the high concentration impurity diffused layers working as the channel region and the source/drain regions and optimizing the conditions for the impurity ion implantation and the annealing. Furthermore, it goes without saying that a CMOS semiconductor element including both an n-channel semiconductor element and a p-channel semiconductor element can be formed. Also with regard to the hot electron transistor, one having the structure corresponding to that of an npn bipolar transistor as in this embodiment and another having the structure corresponding to that of a pnp bipolar transistor can be formed together. In a hot electron transistor, a current can be controlled by a potential barrier of the energy barrier film, and hence, the power amplifying function similar to that of a bipolar transistor can be obtained even when the semiconductor film and the polysilicon film have the same conductivity type. However, when these films include impurities of different conductivity types, the resultant hot electron transistor can exhibit a better operation characteristic.

Moreover, in the procedure shown in FIG. 17, the mask oxide film 306a (mask insulating film) used in this embodiment for exposing a part of the p-type Si layer 390 through the photolithography and the dry etching has the same shape as the mask oxide film 106a having the projections and recesses at different portions on respective sides in a plan view as shown in FIG. 12(a). However, a rectangular mask film as is described in Japanese Laid-Open Patent Publication No. 07-312419 can be used. Alternatively, a mask film having the same shape as the mask oxide film 106a of FIG. 13 can be used.

Each of the oxide films 307a and 307b can be replaced with a silicon nitride film or a silicon nitrided oxide film. Furthermore, the gate insulating film of the semiconductor element and the etching mask for the p-type Si layer 390 of the hot electron transistor can be formed out of a silicon nitride film or a silicon nitrided oxide film in stead of the silicon oxide film.

(Other Embodiments)

It is also possible to manufacture the following semiconductor devices by combining the hot electron transistor as described in the third embodiment with another type of element, although the detailed structures and manufacturing procedures are herein omitted.

The semiconductor device including the resonance tunnel diode and the MOS transistor formed on the same substrate as described in the first or second embodiment can further include a hot electron transistor. In this case, in addition to the MOS semiconductor element and the bistable memory cell, an analog element having the power amplifying function corresponding to a bipolar transistor is mounted on the resultant semiconductor device. However, in this case, the very thin semiconductor layer of the hot electron transistor and the very thin semiconductor layer of the resonance transistor have preferably different concentrations and different conductivity types of the impurities. This is because the band states of these semiconductor layers for remarkably exhibiting their characteristics are different from each other. Furthermore, the tunnel oxide/energy barrier films of the hot electron transistor need not have the same thickness as the tunnel insulating films of the resonance transistor, but they can be formed in the same thickness. Similarly, the electrodes of the hot electron transistor need not have the same impurity concentration and conductivity type as the electrodes of the resonance transistor.

Also, it is possible to manufacture a semiconductor device including a resonance tunnel diode and a hot electron transistor and excluding a MIS semiconductor element.

What is claimed is:

1. A semiconductor device functioning as a multi-valued memory cell having three or more than three values comprising;

a resonance tunnel diode including first and second conductive portions and a resonance tunneling portion interposed between said first and second conductive portions; and a MIS semiconductor element including a gate electrode and source/drain electrodes, wherein said resonance tunnel diode and said MIS semiconductor element are formed on a common substrate, and at least one of said source/drain electrodes of said MIS semiconductor element is electrically connected with at least one of said first and second conductive portions of said resonance tunnel diode.

2. The semiconductor device of claim 1, wherein said resonance tunneling portion of said resonance tunnel diode includes a very thin Si layer sandwiched between two tunnel insulating films.

3. A semiconductor device functioning as a bistable memory cell or a logic circuit, comprising;

a resonance tunnel diode including first and second conductive portions and a resonance tunneling portion interposed between said first and second conductive portions; and a MIS semiconductor element including a gate electrode and source/drain electrodes, wherein said resonance tunnel diode and said MIS semiconductor element are formed on a common substrate, and at least one of said source/drain electrodes of said MIS semiconductor element is electrically connected with at least one of said first and second conductive portions of said resonance tunnel diode, wherein said MIS semiconductor element is a depletion type semiconductor element, said gate electrode and said source electrode of said MIS semiconductor element are short-circuited to be connected with a power terminal, said drain electrode of said MIS semiconductor element and one of said first and second conductive portions of said resonance tunnel diode are connected with a common control terminal, and said semiconductor device functions as a bistable memory cell.

4. A semiconductor device comprising a substrate including an insulator portion and a resonance tunnel diode and a MIS semiconductor element formed on said insulator portion and insulated from each other, wherein said resonance tunnel diode includes:
a semiconductor film in the shape of a very thin plate extending along a direction crossing a surface of said insulator portion;
first and second tunnel insulating films formed on respective faces of said semiconductor film, each having potential energy sufficiently large to work as a barrier against movement of electrons and a lateral thickness sufficiently small to allow electrons to tunnel therethrough;
first and second conductive portions respectively formed on outer faces of said first and second tunnel insulating films; and
a mask insulating film formed on said semiconductor film and said first and second tunnel insulating films,
said MIS semiconductor element includes:
a channel region formed on said insulator portion;
source/drain regions formed at both sides of said channel region;
a gate insulating film formed on said channel region; and
a gate electrode formed on said gate insulating film, and
said first and second conductive portions of said resonance tunnel diode and said gate electrode of said MIS semiconductor element have a common thickness and are made from a common conductor material.

5. The semiconductor device of claim 4,
wherein said mask insulating film of said resonance tunnel diode and said gate insulating film of said MIS semiconductor element are made from a common insulator material.

6. A semiconductor device comprising a hot electron transistor mounted on a substrate including an insulator portion,
wherein said hot electron transistor includes:
a semiconductor film formed on said insulator portion out of a semiconductor material in the shape of a very thin plate extending along a direction crossing a surface of said insulator portion;
a tunnel insulating film formed on one side face of said semiconductor film, having potential energy sufficiently large to work as a barrier against movement of electrons and a lateral thickness sufficiently small to allow electrons to tunnel therethrough;
an energy barrier film formed on the other side face of said semiconductor film having potential energy sufficiently large to work as a barrier against movement of electrons;
first and second conductive portions respectively formed on outer faces of said tunnel insulating film and said energy barrier film; and
a mask insulating film formed on said semiconductor film, said tunnel insulating film and said energy barrier film,
wherein potentials of said first conductive portion, said semiconductor film and said second conductive portion are adjusted so that carriers move from said first conductive portion to said semiconductor film by tunneling and that carriers move from said semiconductor film to said second conductive portion through said energy barrier film,
wherein a bottom face of said semiconductor film is the oriented surface, side faces of said semiconductor film are the {110} oriented surface, and said semiconductor film extends along a direction substantially vertical to the surface of said insulator portion.

7. The semiconductor device of claim 6,
wherein a MIS semiconductor element is formed on said insulator portion to be insulated from said hot electron transistor,
said MIS semiconductor element includes:
a channel region formed on said insulator portion;
source/drain regions formed at both sides of said channel region;
a gate insulating film formed on said channel region; and
a gate electrode formed on said gate insulating film, and
said mask insulating film of said hot electron transistor and said gate insulating film of said MIS semiconductor element are made from a common insulator material.

8. The semiconductor device of claim 6,
wherein a MIS semiconductor element is formed on said insulator portion to be insulated from said hot electron transistor, said MIS semiconductor element includes:
a channel region formed on said insulator portion;
source/drain regions formed at both sides of said channel region;
a gate insulating film formed on said channel region; and
a gate electrode formed on said gate insulating film, and
said first and second conductive portions of said hot electron transistor and said gate electrode of said MIS semiconductor element are made from a common conductor material.

9. The semiconductor device of claim 8,
wherein said mask insulating film of said hot electron transistor and said gate insulating film of said MIS semiconductor element are made from a common insulator material.

10. The semiconductor device of claim 6,
wherein a resonance tunnel diode insulated from said hot electron transistor and a MIS semiconductor element insulated from said hot electron transistor and said resonance tunnel diode are formed on said insulator portion,
said resonance tunnel diode includes:
a semiconductor film in the shape of a thin plate extending along a direction crossing the surface of said insulator portion;
first and second tunnel insulating films formed on respective side faces of said semiconductor film, each having potential energy sufficiently large to work as a barrier against movement of electrons and a lateral thickness sufficiently small to allow electrons to tunnel therethrough;

first and second conductive portions respectively formed on outer surfaces of said first and second tunnel insulating films; and a mask insulating film formed on said semiconductor film and said first and second tunnel insulating films, said MIS semiconductor element includes:
a channel region formed on said insulator portion;
source/drain regions formed at both sides of said channel region;
a gate insulating film formed on said channel region; and
a gate electrode formed on said gate insulating film, and
said mask insulating film of said hot electron transistor, said mask insulating film of said resonance tunnel diode and said gate insulating film of said MIS semiconductor element are made from a common insulator material.

11. The semiconductor device of claim 6, wherein a resonance tunnel diode insulated from said hot electron transistor and a MIS semiconductor element insulated from said hot electron transistor and said resonance tunnel diode are formed on said insulator portion, said resonance tunnel diode includes:
a semiconductor film in the shape of a very thin plate extending along a direction crossing the surface of said insulator portion;
first and second tunnel insulating films formed on respective side faces of said semiconductor film, each having potential energy sufficiently large to work as a barrier against movement of electrons and a lateral thickness sufficiently small to allow electrons to tunnel therethrough;
first and second conductive portions respectively formed on outer faces of said first and second tunnel insulating films; and
a mask insulating film formed on said semiconductor film and said first and second tunnel insulating films, said MIS semiconductor element includes:
a channel region formed on said insulator portion;
source/drain regions formed at both sides of said channel region;
a gate insulating film formed on said channel region; and
a gate electrode formed on said gate insulating film, and said first and second conductive portions of said hot electron transistor, said first and second conductive portions of said resonance tunnel diode and said gate electrode of said MIS semiconductor element are made from a common conductor material.

12. The semiconductor device of claim 11, wherein said mask insulating film of said resonance tunnel diode, said gate insulating film of said MIS semiconductor element and said mask insulating film of said hot electron transistor are made from a common insulator material.

13. A semiconductor device comprising a hot electron transistor mounted on a substrate including an insulator portion, wherein said hot electron transistor includes:
a semiconductor film formed on said insulator portion out of a semiconductor material in the shape of a very thin plate extending along a direction crossing a surf ace of said insulator portion;
a tunnel insulating film formed on one side face of said semiconductor film, having potential energy sufficiently large to work as a barrier against movement of electrons and a lateral thickness sufficiently small to allow electrons to tunnel therethrough;
an energy barrier film formed on the other side face of said semiconductor film having potential energy sufficiently large to work as a barrier against movement of electrons;
first and second conductive portions respectively formed on outer faces of said tunnel insulating film and said energy barrier film; and
a mask insulating film formed on said semiconductor film, said tunnel insulating film and said energy barrier film,
wherein potentials of said first conductive portion, said semiconductor film and said second conductive portion are adjusted so that carriers move from said first conductive portion to said semiconductor film by tunneling and that carriers move from said semiconductor film to said second conductive portion through said energy barrier film,
wherein said first and second conducive portions are made from a polysilicon film, and
wherein an impurity of a first conductivity type is introduced into said semiconductor film, and an impurity of a second conductivity type is introduced into said polysilicon film.

* * * * *